(12) United States Patent
Naiini et al.

(10) Patent No.: US 7,407,731 B2
(45) Date of Patent: Aug. 5, 2008

(54) PHOTOSENSITIVE RESIN COMPOSITIONS

(75) Inventors: Ahmad A. Naiini, East Greenwich, RI (US); David B. Powell, Minnetonka, MN (US); N. Jon Metivier, Billerica, MA (US); Donald F. Perry, North Providence, MA (US)

(73) Assignee: Fujifilm Electronic Materials U.S.A., Inc., North Kingstown, RI (US)

( * ) Notice: Subject to any disclaimer, the term of this patent is extended or adjusted under 35 U.S.C. 154(b) by 247 days.

(21) Appl. No.: 11/386,471

(22) Filed: Mar. 22, 2006

(65) Prior Publication Data

US 2006/0216641 A1    Sep. 28, 2006

Related U.S. Application Data

(60) Provisional application No. 60/689,347, filed on Jun. 10, 2005, provisional application No. 60/665,546, filed on Mar. 25, 2005.

(51) Int. Cl.
*G03F 7/023* (2006.01)
*G03F 7/30* (2006.01)

(52) U.S. Cl. ............ 430/18; 430/190; 430/191; 430/192; 430/193; 430/270.1; 430/280.1; 430/325; 430/326; 430/330

(58) Field of Classification Search ......... 430/18, 430/190, 191, 192, 193, 270.1, 280.1, 325, 430/326, 330
See application file for complete search history.

(56) References Cited

U.S. PATENT DOCUMENTS

| | | | |
|---|---|---|---|
| 3,645,772 A | 2/1972 | Jones | |
| 3,873,316 A | 3/1975 | Velten et al. | |
| 5,496,590 A | 3/1996 | Maki et al. | |
| 6,001,517 A | 12/1999 | Kawamonzen | |
| 6,159,654 A | 12/2000 | Machida et al. | |
| 6,183,934 B1 | 2/2001 | Kawamonzen | |
| 7,132,205 B2 * | 11/2006 | Rushkin et al. | 430/18 |
| 7,220,520 B2 * | 5/2007 | Naiini et al. | 430/18 |
| 7,282,323 B2 * | 10/2007 | Kanatani et al. | 430/281.1 |
| 2006/0240358 A1 * | 10/2006 | Powell et al. | 430/311 |

FOREIGN PATENT DOCUMENTS

| | | |
|---|---|---|
| JP | 9316326 | 12/1997 |
| JP | 09325480 | 12/1997 |
| JP | 2004264537 | 9/2004 |
| WO | WO2005101125 | 10/2005 |

OTHER PUBLICATIONS

Studies of polyimide/copper interface and its improvement by a two-component primer, Dong, Jian, et al. Department Polymer Science and Engineering, Nanjing University, Nanjing, 210093, Peop. Rep. China, Huethig & Wepf, pp. 143-157, 1995.
The formation of an effective anti-corrosion film on copper surfaces from 2-mercaptobenzimidazole solution, Xue, Gi et al., Dep. Chem., Nanjing Univ., Nanjing, 210008, Peop. Rep. China, Journal of Electroanalytical Chemistry and Interfacial Electrochemistry, pp. 139-148, 1991.
International Search Report and Written Opinion for PCT/US06/10394 dated Nov. 13, 2007.

* cited by examiner

*Primary Examiner*—John S Chu
(74) *Attorney, Agent, or Firm*—Fish & Richardson P.C.

(57) ABSTRACT

A photosensitive resin composition comprising:
(a) at least one polybenzoxazole precursor polymer;
(b) at least one compound having Structure VI

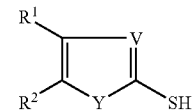

VI wherein, V is CH or N, Y is O or $NR^3$ wherein $R^3$ is H, $CH_3$ or $C_2H_5$, $R^1$ and $R^2$ each independently are H, $C_1$-$C_4$ alkyl group, $C_1$-$C_4$ alkoxy group, cyclopentyl or cyclohexyl, or alternatively, $R^1$ and $R^2$ can be fused to produce a substituted or unsubstituted benzene ring; and
(c) at least one solvent;
  wherein the amount of the compound of Structure VI present in the composition is effective to inhibit residue from forming when the composition is coated on a substrate and the coated substrate is subsequently processed to form an image on the substrate, and
  with the proviso that if the polybenzoxazole precursor polymer solely consists of polybenzoxazole precursor polymers that do not contain a photoactive moiety in the polymer, then
(d) at least one photoactive compound is also present in the composition. The present invention also concerns a process for forming a relief pattern and electronic parts using the composition.

26 Claims, No Drawings

PHOTOSENSITIVE RESIN COMPOSITIONS

RELATED APPLICATIONS

This application claims priority from Provisional Patent Application No. 60/665,546, filed Mar. 25, 2005, and U.S. Provisional patent Application No. 60/689,347, filed Jun. 10, 2005.

FIELD OF THE INVENTION

The present invention relates to buffer coat resin compositions. More specifically, the present invention relates to both positive tone and negative tone photosensitive compositions, a process of use for said compositions, and electronic parts produced by said process of use.

BACKGROUND OF THE INVENTION

In microelectronic applications, polymers that demonstrate high temperature resistance such as polyimides and polybenzoxazoles are generally well known. Precursors of such polymers, can be made photoreactive with suitable additives. The precursors are converted to the desired polymer by known techniques such as exposure to high temperatures. The polymer precursors are used to prepare protective layers, insulating layers, and relief structures of highly heat-resistant polymers.

As the dimension of the photolithographic pattern on a wafer continues to shrink below 0.18 microns, greater demands are placed on lithographic equipment and materials. To meet this challenge, the semiconductor industry is changing from aluminum based alloys and silicon dioxide to copper metal and low dielectric constant (low-k) materials to manufacture chips. When using the new low-k dielectrics there is a decrease in capacitance, which is critical to improving integrated circuit performance, especially for higher density memory chips. Copper is known to have as much as 40% decreased electrical resistance, carries higher current densities, and has improved electromigration resistance compared to aluminum. Thus, copper interconnects allow decreasing transistor size and shorter wire lengths that result in faster, more powerful devices. Fabrication costs are also lower than with aluminum since copper is less expensive and requires fewer processing steps to produce devices.

Copper metallization provides challenges to the coatings industry since copper can act as a catalyst and destabilize systems that are optimized for coating over aluminum. In addition, cuprous and cupric ions present on the copper surface can bind strongly with some polymers and reduce the ability to dissolve off the polymers during certain wafer processes. This results in the presence of some residue on copper surfaces after it is coated by a photosensitive composition, softbaked, exposed and developed. With the increased use of copper metallization in semiconductor devices, it is important to develop coating systems that are compatible with copper and copper processing.

Conventional positive-working photosensitive polybenzoxazole (PBO) compositions contain an alkaline soluble PBO precursor and a diazoquinone photoactive compound (PAC) as disclosed in U.S. Pat. Nos. 4,339,521, 4,371,685, 4,849,051, and 5,376,499. The diazoquinone compound inhibits the solubility of PBO precursor in an aqueous base. However after exposure to light, the diazoquinone compound undergoes photolysis and converts to indene carboxylic acid, which promotes solubility of the PBO precursor in the aqueous base. U.S. Pat. No. 5,037,720 disclosed a positive-working photosensitive polybenzoxazole composition containing an alkaline soluble PBO precursor in which part of OH groups were substituted with a diazoquinone moiety. In this case no PAC was used in the composition. U.S. Pat. Nos. 6,177,225 and 6,214,516 disclosed compositions containing both PBO precursor in which part of the OH groups were substituted by diazoquinone moiety and PAC.

SUMMARY OF THE INVENTION

The present invention is directed to a photosensitive resin composition comprising:
(a) at least one polybenzoxazole precursor polymer;
(b) at least one compound having Structure VI

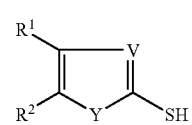

VI wherein, V is CH or N, Y is O or $NR^3$ wherein $R^3$ is H, $CH_3$ or $C_2H_5$, $R^1$ and $R^2$ each independently are H, $C_1$-$C_4$ alkyl group, $C_1$-$C_4$ alkoxy group, cyclopentyl or cyclohexyl, or alternatively, $R^1$ and $R^2$ can be fused to produce a substituted or unsubstituted benzene ring; and
(c) at least one solvent;
wherein the amount of the compound of Structure VI present in the composition is an amount effective to inhibit residue from forming when the composition is coated on a substrate and the coated substrate is subsequently processed to form an image on the substrate, and
with the proviso that if the polybenzoxazole precursor polymer solely consists of polybenzoxazole precursor polymers that do not contain a photoactive moiety in the polymer, then
(d) at least one photoactive compound is also present in the composition.

The present invention also concerns a process for forming a relief pattern and electronic parts using the composition.

DETAILED DESCRIPTION OF THE INVENTION

The present invention is directed to photosensitive resin compositions comprising:
(a) at least one polybenzoxazole precursor polymer;
(b) at least one compound having Structure VI

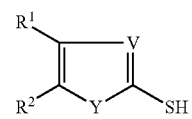

VI wherein, V is CH or N, Y is O or $NR^3$ wherein $R^3$ is H, $CH_3$ or $C_2H_5$, $R^1$ and $R^2$ each independently are H, $C_1$-$C_4$ alkyl group, $C_1$-$C_4$ alkoxy group, cyclopentyl or cyclohexyl, or alternatively, $R^1$ and $R^2$ can be fused to produce a substituted or unsubstituted benzene ring; and
(c) at least one solvent.
wherein the amount of the compound of Structure VI present in the composition is an amount effective to inhibit residue from forming when the composition is coated on a substrate and the coated substrate is subsequently processed to form an image on the substrate, and with the proviso that if the polybenzoxazole precursor polymer solely consists of polybenzoxazole precursor polymers that do not contain a photoactive moiety in the polymer, then (d) at least one photoactive compound is also present in the composition.

One embodiment of the present invention is directed to a positive photosensitive resin composition comprising:

(a) at least one polybenzoxazole precursor polymer having Structure I or II or III or III* or IV or IV* or V.

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon; $Ar^3$ is a divalent aromatic group, a divalent aliphatic group, a divalent heterocyclic group, or mixtures thereof; $Ar^4$ is $Ar_1(OH)_2$ or $Ar^2$, x is from about 10 to about 1000; y is from 0 to about 900; D is one of the following moieties:

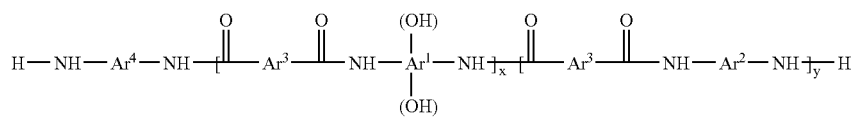 I

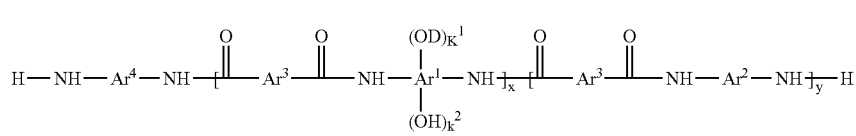 II

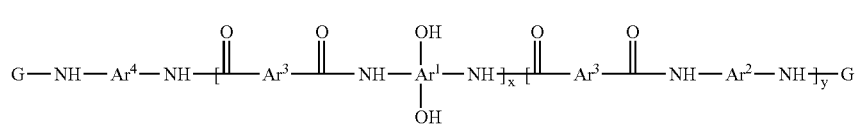 III

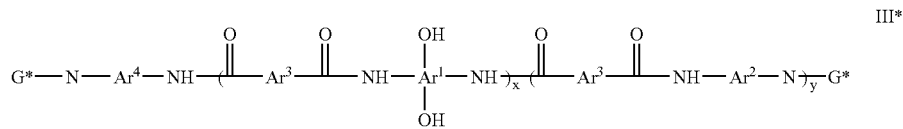 III*

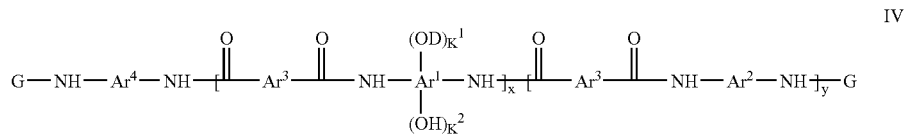 IV

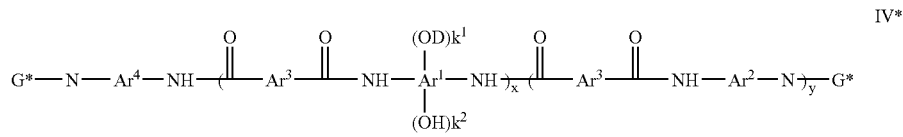 IV*

 V

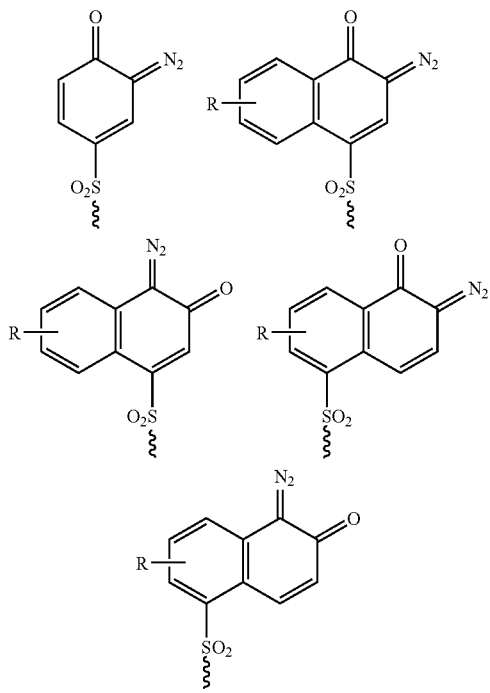

wherein, R is H, halogen, a $C_1$-$C_4$ alkyl group, a $C_1$-$C_4$ alkoxy group, cyclopentyl, or cyclohexyl; $k^1$ can be any positive value of up to about 0.5, $k^2$ can be any value from about 1.5 to about 2 with the proviso that $(k^1+k^2)=2$, G is a monovalent organic group having a carbonyl, carbonyloxy or sulfonyl group; G* is a divalent organic group having at least one carbonyl or sulfonyl group; $Ar^7$ represents a bivalent to octavalent organic group with at least two carbon atoms, $Ar^8$ represent a bivalent to hexavalent organic group with at least two carbon atoms, and $R^4$ represent hydrogen or an organic group with 1 to 10 carbons, $m^1$ and $m^3$ are integers in the range of 0 to 4 but $m^1$ and $m^3$ cannot be simultaneously 0 and $m^2$ is an integer in the range of 0 to 2;

(b) at least one component selected from Structure VI

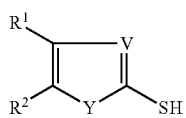

VI wherein, V is CH or N, Y is O or $NR^3$ wherein $R^3$ is H, $CH_3$ or $C_2H_5$, $R^1$ and $R^2$ each independently are H, $C_1$-$C_4$ alkyl group, $C_1$-$C_4$ alkoxy group, cyclopentyl or cyclohexyl or alternatively, $R^1$ and $R^2$ can be fused to produce a substituted or unsubstituted benzene ring, and (c) at least one solvent, with the proviso that if the polybenzoxazole precursor polymer solely consists of Structure I or III or V or a mixture containing any of the three, then (d) at least one photoactive compound is added.

The polymers of Structure I can be prepared from monomers having Structures X, XI and XII. Monomers having Structures X, XI and XII are reacted in the presence of a base to synthesize polybenzoxazole precursor polymers of Structure I.

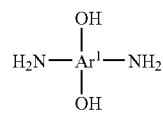

X

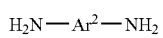

XI

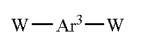

XII $Ar^1$, $Ar^2$, $Ar^3$ are as previously defined, and W is C(O)Cl, COOH or C(O)$OR^{12}$ and wherein $R^{12}$ is a $C_1$-$C_7$ linear or branched alkyl group or a $C_5$-$C_8$ cycloalkyl group.

In Structures I, II, III, III*, IV, IV* and X, $Ar^1$ is a tetravalent aromatic or a tetravalent heterocyclic group. Examples of $Ar^1$ include but are not limited to:

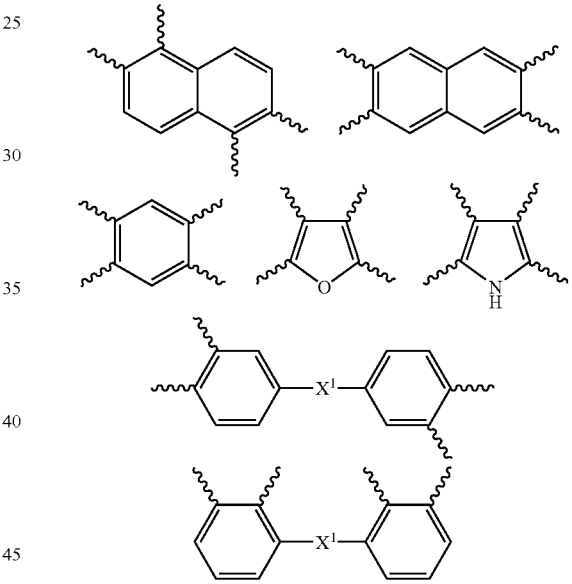

wherein $X^1$ is —O—, —S—, —C($CF_3$)$_2$—, —C($CH_3$)$_2$—, —$CH_2$—, —$SO_2$—, —NHCO— or —Si$R^{13}_2$— and each $R^{13}$ is independently a $C_1$-$C_7$ linear or branched alkyl or $C_5$-$C_8$ cycloalkyl group. Examples of $R^{13}$ include, but are not limited to, —$CH_3$, —$C_2H_5$, n-$C_3H_7$, i-$C_3H_7$, n-$C_4H_9$, t-$C_4H_9$, and cyclohexyl.

Examples of monomers having the Structure X containing $Ar^1$ include but are not limited to 2,2-bis(3-amino-4-hydroxyphenyl)hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl)propane. The substitution pattern of the two hydroxy and two amino groups in the monomer of Structure X may be any of the possible substitution patterns with the proviso that the each amino group has an ortho relationship with a hydroxyl group in order to be able to form the benzoxazole ring. Furthermore, the polybenzoxazole precursor base polymer, may be synthesized using a mixture of two or more monomers described by generic Structure X.

In Structures I, II, III, III*, IV, IV*, and XI, $Ar^2$ is a divalent aromatic, a divalent heterocyclic, a divalent alicyclic, or a divalent aliphatic group that may contain silicon. Examples of $Ar^2$ include but are not limited to:

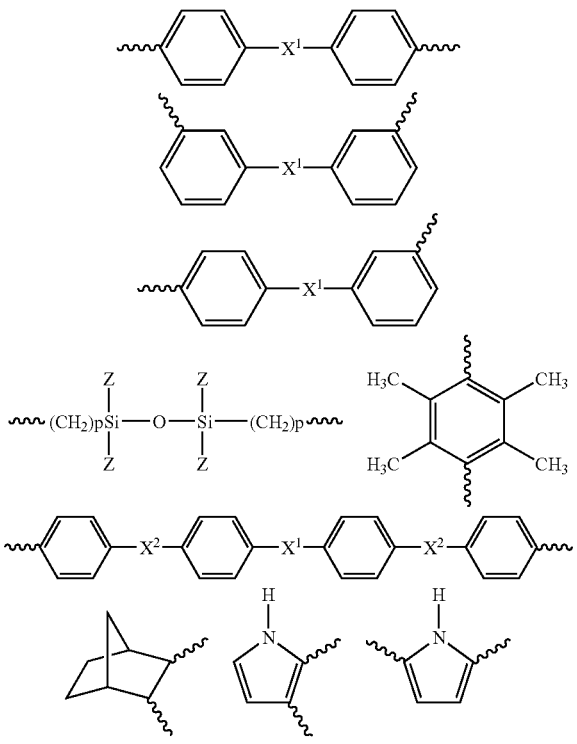

wherein $X^1$ is —O—, —S—, —C(CF$_3$)$_2$—, —C(CH$_3$)$_2$—, —CH$_2$—, —SO$_2$—, —NHCO— or —SiR$^{13}$$_2$— and each $R^{13}$ is independently a C$_1$-C$_7$ linear or branched alkyl or C$_5$-C$_8$ cycloalkyl group, $X^2$ is —O—, —S—, —C(CF$_3$)$_2$—, —C(CH$_3$)$_2$—, —CH$_2$—, —SO$_2$—, or —NHCO—, Z=H or C$_1$-C$_8$ linear, branched or cyclic alkyl and p is an integer from 1 to 6. Examples of suitable Z groups include, but are not limited to, methyl, ethyl, propyl, isopropyl, n-butyl, sec-butyl, t-butyl, n-octyl, cyclopentyl, cyclohexyl and cyclooctyl.

Examples of monomers having the Structure XI containing $Ar^2$ include, but are not limited to, 5(6)-diamino-1-(4-aminophenyl)-1,3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 3,3'-diaminodiphenyl ether, 2,4-toluenediamine, 3,3'-diaminodiphenyl sulfone, 3,4'-diaminodiphenyl sulfone, 4,4'-diaminodiphenyl sulfone, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis(4-aminophenoxy)benzene, 1,3-bis(3-aminophenoxy) benzene, 1,4-bis(gamma-aminopropyl) tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2- dimethylpropylenediamine, 1,10-diamino-1,10-dimethyldecane, 2,11-diaminidodecane, 1,12-diaminooctadecane, 2,17-diaminoeicosane, 3,3'-dimethyl-4,4'-diaminodiphenylmethane, bis(4-aminocyclohexyl) methane, 3,3'-diaminodiphenylethane, 4,4'-diaminodiphenylethane, 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline). Furthermore, the polybenzoxazole precursor base polymer, may be synthesized using a mixture of two or more monomers described by generic Structure XI.

In Structures I, II, III, III*, IV, IV*, and XII, $Ar^3$ is a divalent aromatic, a divalent aliphatic, or a divalent heterocyclic group. Examples of $Ar^3$ include but are not limited to:

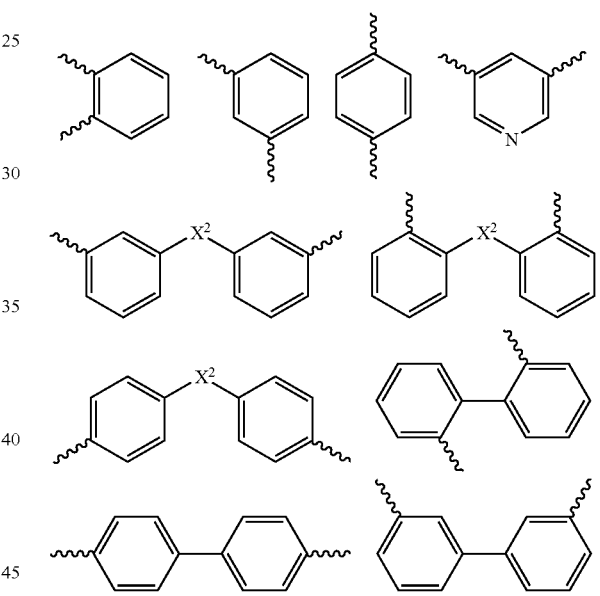

wherein $X^2$ is —O—, —S—, —C(CF$_3$)$_2$—, —C(CH$_3$)$_2$—, —CH$_2$—, —SO$_2$—, or —NHCO—.

In Structure XII, W is C(O)Cl, COOH or C(O)OR$^{12}$ wherein $R^{12}$ is C$_1$-C$_7$ linear or branched alkyl group or a C$_5$-C$_8$ cycloalkyl group. Examples of $R^{12}$ include, but are not limited to, —CH$_3$, —C$_2$H$_5$, n-C$_3$H$_7$, i-C$_3$H$_7$, n-C$_4$H$_9$, t-C$_4$H$_9$, and cyclohexyl.

Monomers having the Structure XII are diacids, diacid dichlorides and diesters. Examples of suitable dicarboxylic acids (W=COOH) include, but are not limited to, 4,4'-diphenyletherdicarboxylic acid, terephthalic acid, isophthalic acid and mixtures thereof. Examples of suitable diacid chlorides (W=COCl) include, but are not limited to, isophthaloyl dichloride, phthaloyl dichloride, terephthaloyl dichloride, 1,4-oxydibenzoyl chloride and mixtures thereof. Examples of suitable dicarboxylic esters (W=C(O)OR$^{12}$) include, but are not limited to: dimethyl isophthalate, dimethyl phthalate, dimethyl terephthalate, diethyl isophthalate, diethyl phthalate, diethyl terephthalate and mixtures thereof.

Monomers having Structures X and XI and XII react to produce a polybenzoxazole precursor base polymer of Structure I. Any conventional method for reacting a dicarboxylic acid or its dichloride or diester with at least one aromatic and/or heterocyclic dihydroxydiamine, and optionally, with at least one diamine, may be used. Generally, the reaction for diacid dichlorides (W=C(O)Cl) is carried out at about −10° C. to about 30° C. for about 6 to about 48 hours in the presence of an approximately stoichiometric amount of amine base. Examples of suitable amine bases include, but are not limited to pyridine, triethyl amine, 1,8-diazabicyclo[5.4.0]undec-7-ene (DBU), 1,5-diazabicyclo[4.3.0]non-5-ene (DBN), dimethylpyridine, and dimethylaniline. The polybenzoxazole precursor base polymer of Structure I may be isolated by precipitation into water, recovered by filtration and dried. Descriptions of suitable syntheses employing diesters or diacids may be found in U.S. Pat. Nos. 4,395,482, 4,622,285, and 5,096,999, herein incorporated by reference.

Structure I by the average molecular weight of the repeat unit. The value of Mn can be determined by such standard methods as membrane osmometry or gel permeation chromatography as described, for example, in Jan Rabek, Experimental Methods in Polymer Chemistry, John Wiley & Sons, New York, 1983.

It should be noted that molecular weight and inherent viscosity of the polymers and therefore, x and y at a constant stoichiometry, can have a wide range depending on the reaction conditions chosen and considerations such as the purity of the solvent, the humidity, presence or absence of a blanket of nitrogen or argon gas, reaction temperature, reaction time, and other variables.

Polybenzoxazole precursor polymer of Structure II may be synthesized by reaction of the polybenzoxazole precursor polymer of Structure I with about 1% to about 40 mole % of a diazoquinone (based on the number of OH groups from the monomer of Structure I) in the presence of a base to yield the polybenzoxazole precursor of Structure II according to Reaction 1.

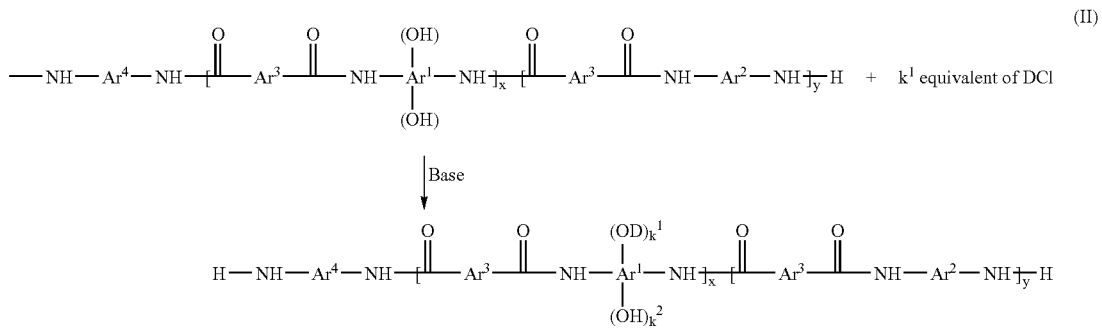

The preferred reaction solvents are N-methyl-2-pyrrolidone (NMP), N-ethyl-2-pyrrolidone (NEP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred solvents are N-methyl-2-pyrrolidone (NMP) and gamma-butyrolactone (GBL).

Monomers having Structure X, XI, and XII are employed such that the ratio of [X+XI]/XII is generally from about 1 to about 1.2. Preferably, the ratio of [X+XI]/XII is generally from about 1 to about 1.1. The monomer having the Structure X is employed from about 10 to about 100 mole % of [X+XI] and the monomer having Structure XI is employed from about 0 to about 90 mole % of [X+XI]. Distribution of the polymeric units resulting from monomers having the Structures X and XI in the polybenzoxazole precursor base polymer may be random or in blocks within it.

In Structures I, II, III, III*, IV or IV* x is an integer from about 10 to about 1000, y is an integer from about 0 to about 900 and (x+y) is about less then 1000. A preferred range for x is from about 10 to about 300 and a preferred range for y is from about 0 to about 250. A more preferred range for x is from about 10 to about 100 and a more preferred range for y is from about 0 to about 100. The most preferred range for x is from about 10 to about 50 and a most preferred range for y is from about 0 to about 5.

The amount of (x+y) can be calculated by dividing the numeric average molecular weight (Mn) of a polymer of wherein $Ar^1$, $Ar^2$, $Ar^3$, $Ar^4$, D, $k^1$, $k^2$, x and y are as previously defined Examples of the diazoquinone compound DCl that can be reacted with the PBO polymer I include but are not limited to one of the following:

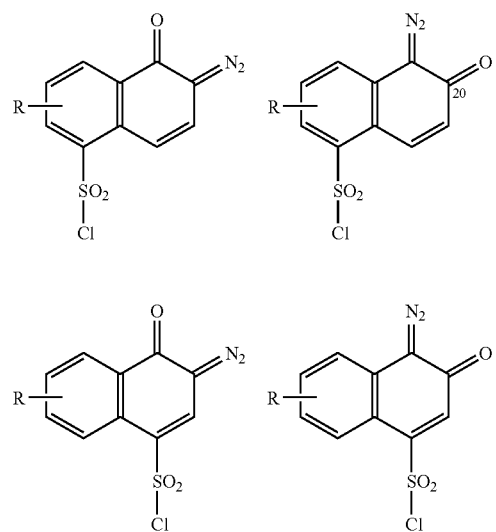

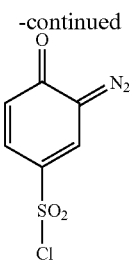

wherein, R is H, a halogen, a $C_1$-$C_4$ alkyl group, a $C_1$-$C_4$ alkoxy group, cyclopentyl or cyclohexyl. Examples of suitable R groups include, but are not limited to, methyl, ethyl, propyl, iso-propyl, n-butyl, sec-butyl, t-butyl, cyclopentyl or cyclohexyl.

Generally, the reaction is carried out at about 0° C. to about 30° C. for about 3 to about 24 hours in a solvent in the presence of a base. Generally, a slight excess of base to DCl is employed. Examples of bases include but are not limited to amine bases such as pyridine, trialkylamine, methylpyridine, lutidine, n-methylmorpholine, and the like. The most preferred base is triethylamine. The preferred reaction solvents are tetrahydrofuran, acetone, N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred reaction solvents are tetrahydrofuran and acetone. The reaction mixture should be protected from actinic rays.

The molar amount of DCl may range from about 1% to about 40% of the quantity of OH groups from monomers of Structure X to yield $k^1$ from 0.01 to about 0.4. A preferred amount of DCl is from about 1% to about 20% of the quantity of OH groups from monomers of Structure X to produce $k^1$ from about 0.01 to about 0.20. A more preferred amount of DCl is from about 1% to about 10% of the quantity of OH groups from monomers of Structure X to produce $k^1$ from about 0.01 to about 0.10. A most preferred amount of DCl is from about 1% to about 5% of the quantity of OH groups from monomers of Structure X to produce $k^1$ from about 0.01 to about 0.05.

Polybenzoxazole precursor polymers of Structure III:

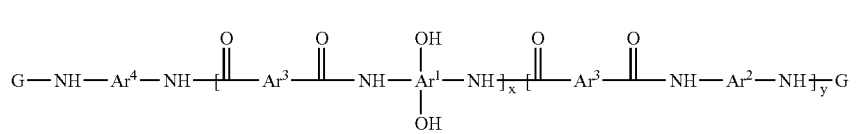

III

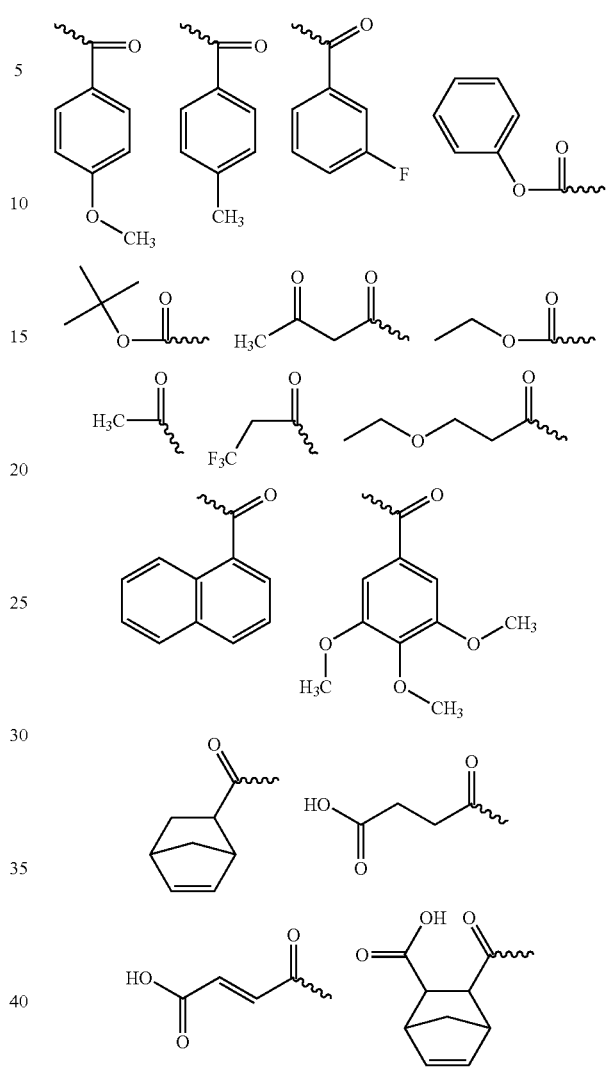

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon; $Ar^3$ is a divalent aromatic group, a divalent aliphatic group, a divalent heterocyclic group, or mixtures thereof; $Ar^4$ is $Ar^1(OH)_2$ or $Ar^2$ and G is a monovalent organic group having a carbonyl, carbonyloxy or sulfonyl group may be synthesized by reaction of polybenzoxazole base polymer of Structure I with G-M where G is a monovalent organic group having a carbonyloxy or sulfonyl group and M is a reactive leaving group. Examples of G include, but are not limited to the following structures:

-continued

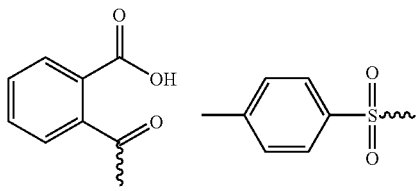

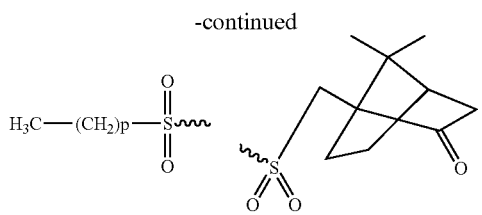

Examples of M groups include, but are not limited to, Cl, Br, mesylate, triflate, substituted carbonyloxy groups, and substituted carbonate groups.

Examples of suitable classes of G-M compounds includes but are not limited to carbon and sulfonic acid chlorides, carbon and sulfonic acid bromides, linear and cyclic carbon and sulfonic acid anhydrides, and alkoxy or aryloxy substituted acid chlorides. Examples of suitable G-M compounds include maleic anhydride, succinic anhydride, acetic anhydride, propionic anhydride, norbornene anhydride, phthalic anhydride, camphor sulfonic acid anhydride, trifluoromethane sulfonic acid anhydride, methanesulfonic acid anhydride, p-toluenesulfonic acid anhydride, ethanesulfonic acid anhydride, butanesulfonic acid anhydride, perfluorobutanesulfonic acid anhydride, acetyl chloride, methanesulfonyl chloride, trifluoromethanesulfonyl chloride, benzoyl chloride, norbornene carboxylic acid chloride, di-t-butyl dicarbonate, dimethyl dicarbonate, diethyldicarbonate, dibutyldicarbonate, t-butyl chloroformate, ethyl chloroformate, n-butyl chloroformate, and methyl chloroformate. Further examples include compounds having the Structures shown below.

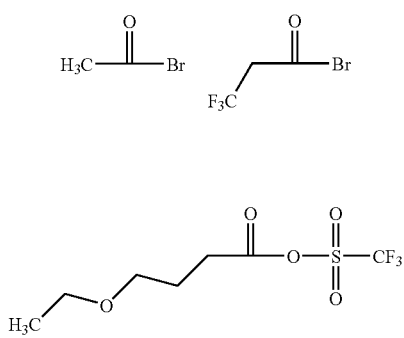

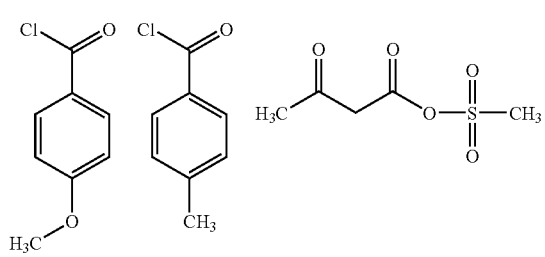

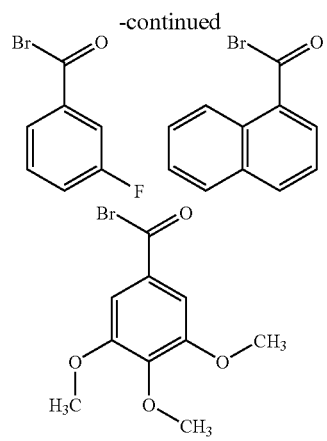

The reaction can be carried out in a suitable solvent by addition of G-M to a dry solution of the polybenzoxazole precursor base polymer at a temperature from about −25° C. to about 40° C. The more preferred temperature is from 0° C. to about 25° C. The most preferred temperature is from about 5° C. to about 10° C. The reaction time is from about 1 hour to about 24 hours. The molar amount of G-M employed is a slightly excess (3-6%) of the sum of the molar amounts of monomer of Structures X and XI less the molar amount of monomer of Structure XII. Addition of organic or inorganic base may also be employed. Examples of suitable organic amine bases include, but are not limited to pyridine, triethyl amine, 1,8-diazabicyclo[5.4.0]undec-7-ene (DBU), 1,5-diazabicyclo[4.3.0]non-5-ene (DBN), dimethylpyridine, and dimethylaniline. Examples of other suitable bases include sodium hydroxide, sodium carbonate, and sodium silicate.

The preferred reaction solvents are propyleneglycol methyl ether acetate (PGMEA), N-methyl-2-pyrrolidone (NMP), N-ethyl-2-pyrrolidone (NEP), gamma-butyrolactone (GBL), N,N-dimethylformamide (DMF), N,N-dimethylacetamide (DMAc), dimethyl-2-piperidone, dimethylsulfoxide (DMSO), tetrahydrofuran (THF), acetone, sulfolane, and diglyme. The most preferred solvents are diglyme and PGMEA.

In some cases, the endcapping reaction with certain endcapping reagents, such as cyclic anhydrides, may not stop after the endcapping reaction. A subsequent dehydration step may also occur to form a divalent endcap (G* in Structures III* and IV*). Examples of cyclic anhydrides which may undergo this additional reaction include, but are not limited to maleic anhydride, succinic anhydride, norbornane anhydride, norbornene anhydride, and camphor anhydride.

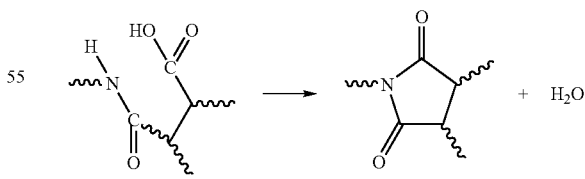

Polybenzoxazole precursor polymer of Structure IV may be synthesized by reaction of polybenzoxazole precursor polymer of Structure III with about 1% to about 40% mole % of a diazoquinone (based on the number of OH groups from the monomer of Structure X) in the presence of a base to yield the polybenzoxazole precursor IV according to Reaction 2.

Reaction 2

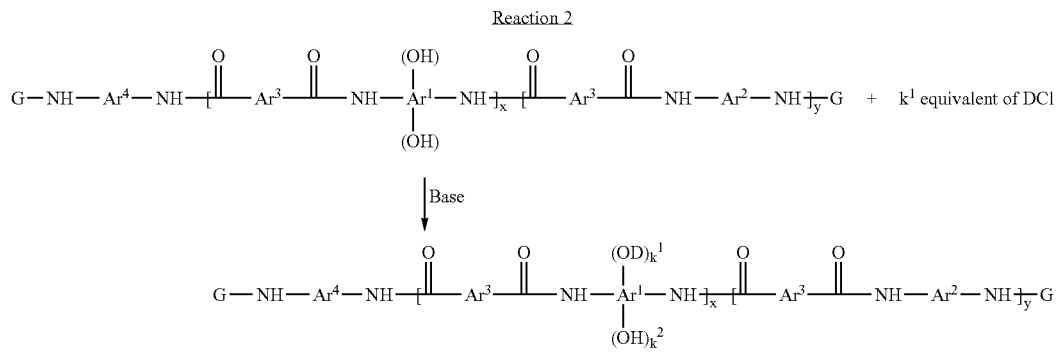

wherein $Ar^1$, $Ar^2$, $Ar^3$, $Ar^4$, D, $k^1$, $k^2$, x, y, and G are as previously defined. Similiarly, the polymer having Structure IV* can be synthesized from the polymer having Structure III*.

Examples of the diazoquinone compound DCl that can be reacted with the PBO polymer III (III*) include but are not limited to one of the following:

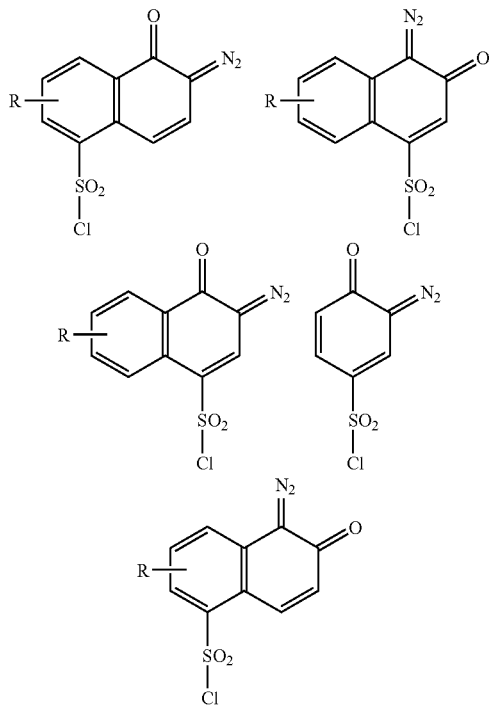

wherein, R is H, a halogen, a $C_1$-$C_4$ alkyl group, $C_1$-$C_4$ alkoxy group, cyclopentyl or cyclohexyl. Examples of suitable R groups include, but are nor limited to, methyl, ethyl, propyl, isopropyl, n-butyl, sec-butyl, t-butyl, cyclopentyl or cyclohexyl.

The molar amount of DCl may range from about 1% to about 40% of the quantity of OH groups from monomers of Structure X to yield $k^1$ from 0.01 to about 0.4. A preferred amount of DCl is from about 1% to about 20% of the quantity of OH groups from monomers of Structure X to produce $k^1$ from about 0.01 to about 0.20. A more preferred amount of DCl is from about 1% to about 10% of the quantity of OH groups from monomers of Structure X to produce $k^1$ from about 0.01 to about 0.10. A most preferred amount of DCl is from about 1% to about 5% of the quantity of OH groups from monomers of Structure X to produce $k^1$ from about 0.01 to about 0.05.

The reaction conditions are identical to that description for the synthesis of polybenzoxazole precursor polymer of Structure II.

A polybenzoxazole precursor polymer of Structure IV (IV*) can also be prepared by reaction of a polybenzoxazole precursor polymer of Structure II with G-M. The definition of G and M are as defined before and the reaction condition is the same as described for the preparation of polybenzoxazole precursor polymer of Structure III (III*).

Polymers of Structure V can be synthesized by the reaction of hydroxysubstituted diamines with dianhydrides as described in U.S. Pat. No. 6,524,764 which is incorporated herein by reference. Polymers of Structure V may be synthesized by mixtures of hydroxysubstituted diamines or mixtures of dianhydrides, or both. Polymers having Structure V, when cured, can form a polymer having imide rings, oxazole rings or other cyclic Structures.

The positive acting photosensitive resin composition of this invention comprises at least one compound having Structure VI:

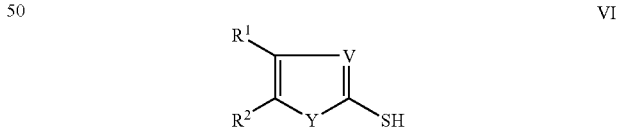

VI wherein, V is CH or N, Y is O or $NR^3$ wherein $R^3$ is H, $CH_3$ or $C_2H_5$, $R^1$ and $R^2$ each independently are H, $C_1$-$C_4$ alkyl group, $C_1$-$C_4$ alkoxy group, cyclopentyl or cyclohexyl, or alternatively, $R^1$ and $R^2$ can be fused to produce a substituted or unsubstituted benzene ring.

Compounds generally described by Structure VI can also exist (and may preferentially exist) in the tautomeric form VI' in certain situations. For the purposes of the description of this invention, both tautomeric forms are considered to be described by Structure VI.

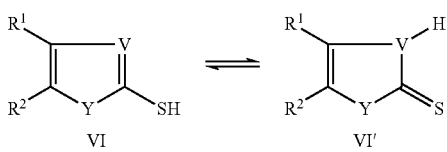

Preferred compounds having Structure VI include, but are not limited to Structures VI-a or VI-b or VI-c or VI-d:

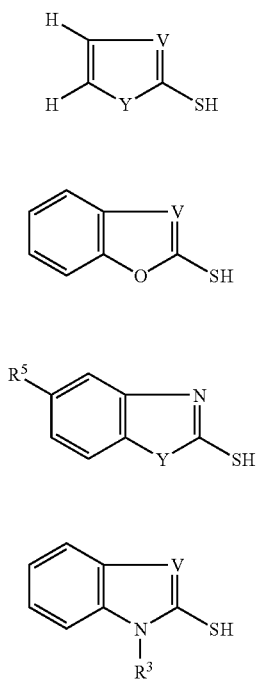

wherein, the definitions of V, Y and $R^3$ are the same as defined earlier, and $R^5$ is H or an electron donating group. Examples of electron donating groups include, but are not limited to, a $C_1$-$C_4$ alkyl group, a. $C_1$-$C_4$ alkoxy group, cyclopentyl and cyclohexyl. In the alternative tautomeric form, preferred compounds VI-a-VI-d would be

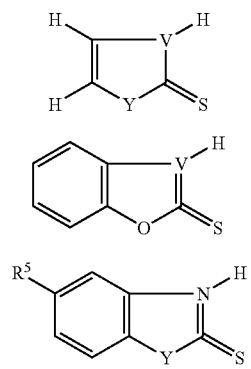

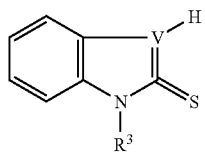

Examples of compounds having Structure VI include, but are not limited to:

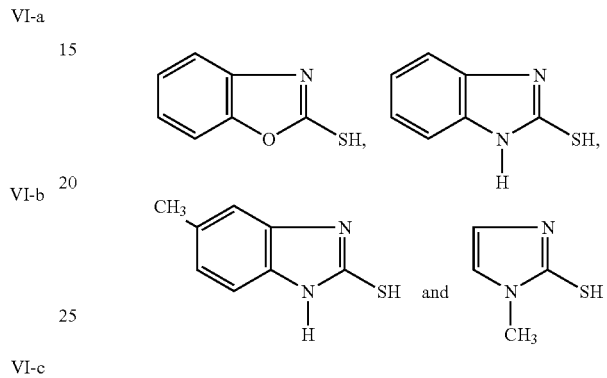

Suitable solvents of this photosensitive composition are polar organic solvents. Suitable examples of polar organic solvents include, but are not limited to, N-methyl-2-pyrrolidone (NMP), gamma-butyrolactone (GBL), N,N-dimethylacetamide (DMAc), dimethyl-2-piperidone, N,N-dimethylformamide (DMF), and mixtures thereof. The preferred solvents are gamma-butyrolactone and N-methyl-2-pyrrolidone. The most preferred solvent is gamma-butyrolactone.

The photoactive compound (d) of the photosensitive resin composition comprises one or more diazonaphthoquinone photoactive compounds which are the condensation products of compounds containing from about 2 to about 9 aromatic hydroxyl groups with one or more compounds of structure D (described above). Preferably structure D is a 5-naphthoquinone diazide sulfonyl compound and/or a 4-naphthoquinone diazide sulfonyl compound. Examples of photoactive compounds are illustrated in structures XIIIa-r.

The phenolic compounds (i.e. the backbone) typically employed in the preparation of a photoactive compound may be prepared by any suitable method. A common method of synthesis is by reaction of a suitable phenol derivative with a suitable aldehyde or ketone in the presence of a solvent such as methanol. The reaction is most often catalyzed by a strong acid (e.g. sulfuric acid or p-toluene sulfonic acid). Generally, the reaction is carried out at about 15° C. to about 80° C. for about 3 hours to about 48 hours.

The photoactive compounds XIII are synthesized by reaction of the backbone with DCl. Generally, the reaction is carried out at about 0° C. to about 30° C. for about 4 to about 36 hours in a solvent in the presence of a base. Generally, a slight excess of base to DCl is employed. Examples of bases include but are not limited to amine bases such as pyridine, trialkylamine, methylpyridine, lutidine, n-methylmorpholine, and the like. The most preferred base is triethylamine. The preferred reaction solvents are tetrahydrofuran (THF), gamma-butyrolactone (GBL), N,N-dimethylformamide (DMF), acetone, N,N-dimethylacetamide (DMAc), dimethyl-2-piperidone, dimethylsulfoxide (DMSO), sulfolane, and diglyme. The most preferred solvents are tetrahydrofuran (THF), acetone and gamma-butyrolactone (GBL). The reaction mixture should be protected from actinic rays.

Examples of compounds XIII include, but are not limited to, one or more of the following compounds where each Q is independently a hydrogen atom XIII a

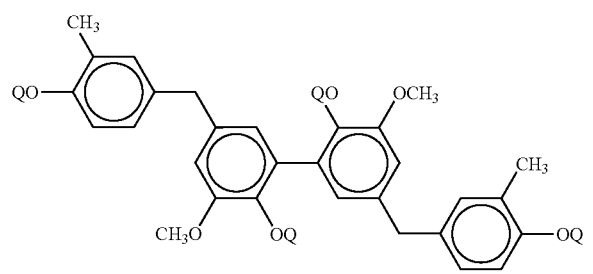

XIII b

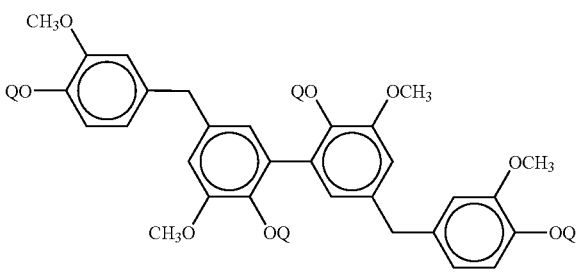

or D with the proviso that at least one Q=D wherein D is as defined before:

XIII c

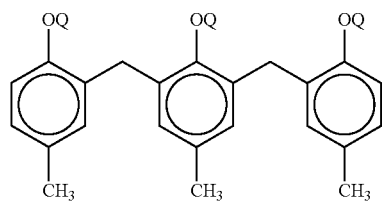

XIII d

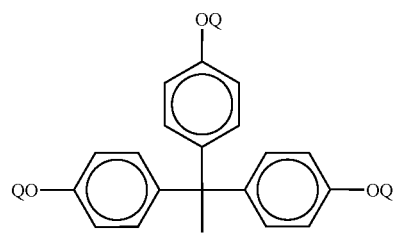

XIIIe

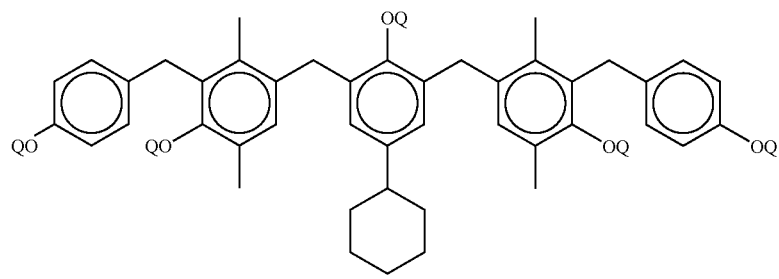

XIIIf

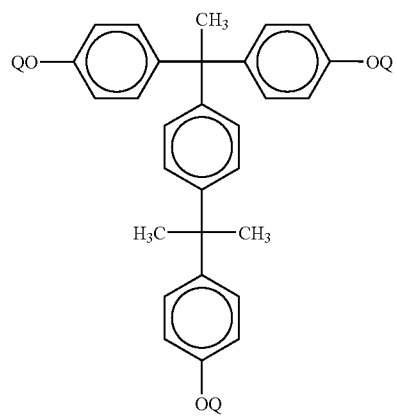

(XIII g)

-continued
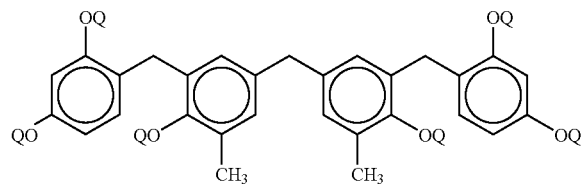
(XIII h)
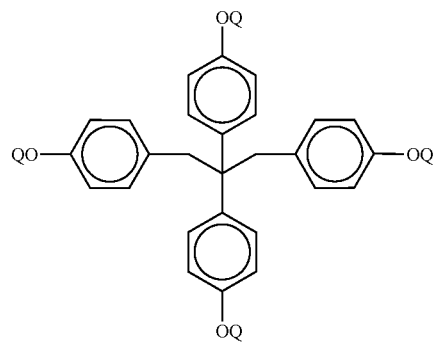
(XIII i)
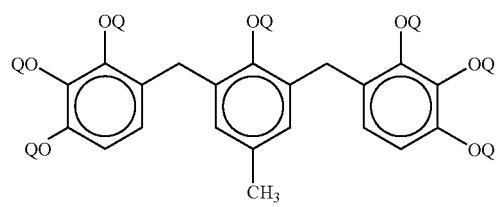
(XIII j)
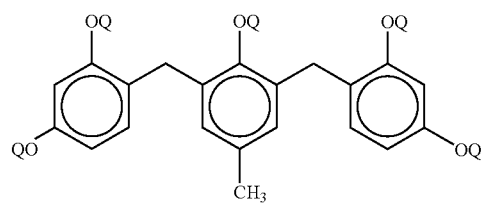
(XIII k)
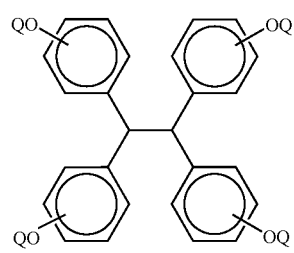
(XIII l)
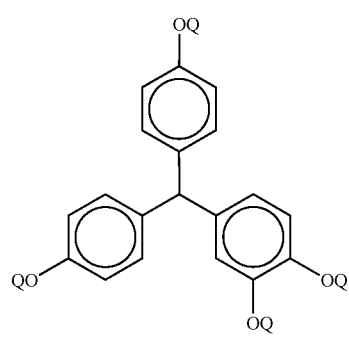
(XIII m)
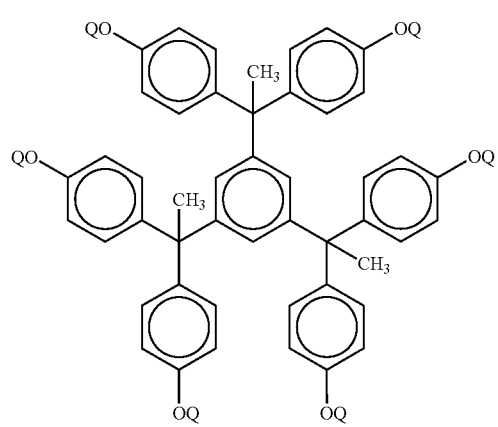
(XIII n)
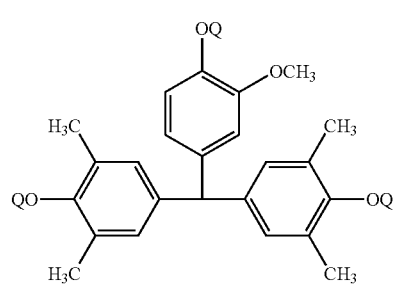
(XIII O)

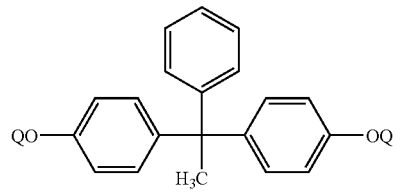

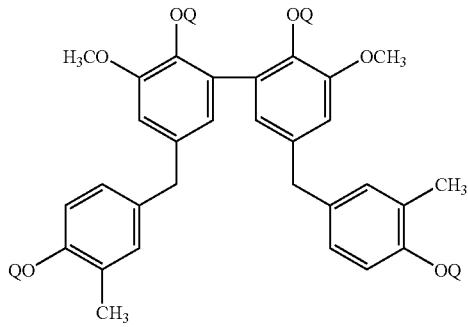

(XIII p)

XIII r

The amount of polybenzoxazole precursor polymer(s) of Structures I, II, III, III*, IV, IV* or V in the photosensitive composition is from about 5 wt. % to about 50 wt. %. The more preferred amount of polybenzoxazole precursor polymers of Structures I, II, III, III*, IV, IV* or V is from about 20 wt. % to about 45 wt. % and the most preferred amount of polybenzoxazole precursor polymers of Structures I, II, III, III*, IV, IV* or V is from about 30 wt. % to about 40 wt. %. Polybenzoxazole precursor polymers of Structures I, II, III, III*, IV, IV* or V can be used singly or be combined in any ratio. Up to 25% of the amount of the polybenzoxazole precursor polymer of Structures I, II, III, III*, IV, IV* or V may be replaced by other organic solvent soluble, aqueous base soluble, aromatic or heterocyclic group polymers or copolymers. Examples of organic solvent soluble, aqueous base soluble, aromatic or heterocyclic group polymers or copolymers may include polyimides, polybenzoimidazoles, polybenzothiazoles, polytriazoles, polyquinazolones, polyquinazolindiones, polyquinacridones, polybenxazinones, polyanthrazolines, polyoxadiazoles, polyhydantoins, polyindophenazines, or polythiadiazoles.

The amount of component selected from Structure VI used in this composition is from about 0.02 wt. % to about 3 wt. % of the total weight of the composition, preferably about 0.05 wt. % to 2 wt. %, and most preferably about 0.06 wt. % to about 1 wt. %.

The solvent component (c) comprises about 40 wt. % to about 80 wt. % of the photosensitive composition. A preferred solvent range is from about 45 wt. % to about 70 wt. %. A more preferred range of solvent is from about 50 wt. % to about 65 wt. %.

The amount of diazoquinone compound (XIII), used in this composition is from about 0 wt. % to about 25 wt. % of the total weight of the composition, preferably from about 2 wt. % to about 12 wt. %, and most preferably from about 3 wt. % to about 6 wt. %. The amount of diazoquinone compound reduces as more of polymer(s) of Structures II or IV or IV* are used. Also the larger $k^1$ becomes, less diazoquinone compound is needed. With large $k^1$, there is no need to use the diazoquinone compound (XIII) because the amount of the diazoquinone moiety in the polymer is sufficient to produce a positive tone photoactive composition.

Optionally, an adhesion promoter may be included in the photosensitive composition. If employed, the amount of adhesion promoter ranges from about 0.1 wt. % to about 2 wt. % of total weight of composition. A preferred amount of adhesion promoter is from about 0.2 wt. % to about 1.5 wt. %. A more preferred amount of adhesion promoter is from about 0.3 wt. % to about 1 wt. %. Suitable adhesion promoters include, for example, amino silanes, and mixtures or derivatives thereof. Examples of suitable adhesion promoters which may be employed in the invention may be described by Structure XIV

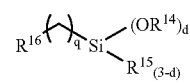

XIV wherein each $R^{14}$ is independently a $C_1$-$C_4$ alkyl group or a $C_5$-$C_7$ cycloalkyl group, each $R^{15}$ is independently a $C_1$-$C_4$ alkyl group, a $C_1$-$C_4$ alkoxy group, a $C_5$-$C_7$ cycloalkyl group or a $C_5$-$C_7$ cycloalkoxy group, d is an integer from 0 to 3 and q is an integer from 1 to about 6, $R^{16}$ is one of the following moieties:

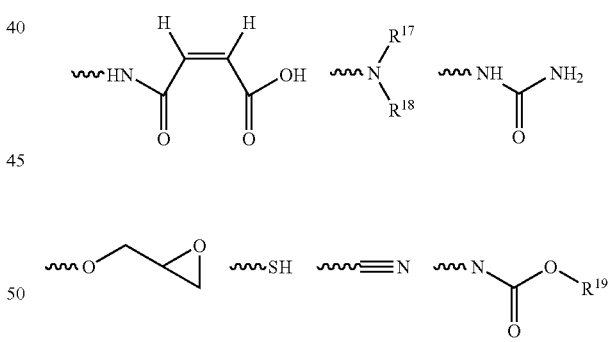

wherein each $R^{17}$ and $R^{18}$ are independently a $C_1$-$C_4$ alkyl group or a $C_5$-$C_7$ cycloalkyl group, and $R^{19}$ is a $C_1$-$C_4$ alkyl group or a $C_5$-$C_7$ cycloalkyl group. Preferred adhesion promoters are those wherein $R^{16}$ is selected from

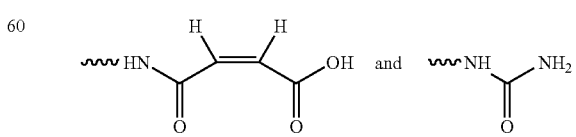

More preferred adhesion promoters are those wherein $R^{16}$ is

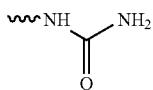

The most preferred adhesion promoters are

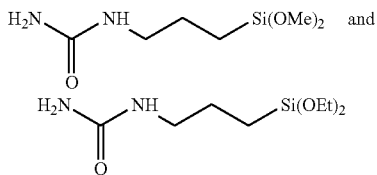

The photosensitive compositions of the present invention may further include other additives. Suitable additives include, for example, leveling agents, dissolution inhibitors and the like. Such additives may be included in the photosensitive compositions in about 0.03 to about 10 wt % of the total weight of composition.

Another embodiment of the present invention concerns a process for forming a relief pattern using the positive photosensitive composition. The process comprises the steps of:

(a) coating on a suitable substrate, a positive-working photosensitive composition comprising one or more polybenzoxazole precursor polymers having Structures I or II or III or III* or IV or IV* or V or mixtures thereof, at least one compound having Structure VI and at least one solvent, with the proviso that if the polybenzoxazole precursor polymer solely consists of I or III or III* or V or a mixture of any of the four, then at least one photoactive compound is also present, thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

The process may optionally include the step of pre-coating a substrate with a solvent containing an adhesion promoter. Any suitable method of treatment of the substrate with adhesion promoter known to those skilled in the art may be employed. Examples include treatment of the substrate with adhesion promoter vapors, solutions or at 100% concentration. The time and temperature of treatment will depend on the particular substrate, adhesion promoter, and method, which may employ elevated temperatures. Any suitable external adhesion promoter may be employed. Classes of suitable external adhesion promoters include but are not limited to vinylalkoxysilanes, methacryloxyalkoxyysilanes, mercaptoalkoxysilanes, aminoalkoxysilanes, epoxyalkoxysilanes and glycidoxyalkoxysilanes. Aminosilanes and glycidoxysilanes are more preferred. Primary aminoalkoxysilanes are more preferred. Examples of suitable external adhesion promoters include, but are not limited to gamma-aminopropyltrimethoxy-silane, gamma-glycidoxypropylmethyldimethoxysilane, gamma-glycidoxypropylmethyldiethoxysilane, gamma-mercaptopropylmethyldimethoxysilane, 3-methacryloxypropyldimethoxymethylsilane, and 3-methacryloxypropyltrimethoxysilane. gamma-Aminopropyltrimethoxysilane is more preferred. Additional suitable adhesion promoters are described in "Silane Coupling Agent" Edwin P. Plueddemann, 1982 Plenum Press, New York.

The positive acting, photoactive composition of this invention is coated on a suitable substrate. The substrate may be, for example, semiconductor materials such as a silicon wafer, compound semiconductor (III-V) or (II-VI) wafer, a ceramic, glass or quartz substrate. Said substrates may also contain films or structures used for electronic circuit fabrication such as organic or inorganic dielectrics, copper or other wiring metals. The preferred substrate for this invention is a wafer containing exposed copper.

Coating methods include, but are not limited to spray coating, spin coating, offset printing, roller coating, screen printing, extrusion coating, meniscus coating, curtain coating, and immersion coating.

The resulting film is prebaked at an elevated temperature. The bake may be completed at one or more temperatures within the temperature bake of from about 70° C. to about 130° C. for several minutes to half an hour, depending on the method, to evaporate the remaining solvent. Any suitable baking means may be employed. Examples of suitable baking means include, but are not limited to, hot plates and convection ovens. The resulting dry film has a thickness of from about 3 to about 50 micron or more preferably from about 4 to about 20 micron or most preferably from about 5 to about 15 micron.

After the bake step, the resulting dry film is exposed to actinic rays in a preferred pattern through a mask. X-rays, electron beam, ultraviolet rays, visible light, and the like can be used as actinic rays. The most preferred rays are those with wavelength of 436 nm (g-line) and 365 nm (i-line).

Following exposure to actinic radiation, in an optional step it may be advantageous to heat the exposed and coated substrate to a temperature between about 70° C. and about 130° C. The exposed and coated substrate is heated in this temperature range for a short period of time, typically several seconds to several minutes and may be carried out using any suitable heating means. Preferred means include baking on a hot plate or in a convection oven. This process step is commonly referred to in the art as post exposure baking.

Next, the film is developed using an aqueous developer and a relief pattern is formed. The aqueous developer contains aqueous base. Examples of suitable bases include, but are not limited to, inorganic alkalis (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1% to about 5%. In addition, an appropriate amount of a surfactant can be added to the developer. Development can be carried out by means of immersion, spray, puddle, or other similar developing methods at temperatures from about 10° C. to about 40° C. for about 30 seconds to about 5 minutes. After development, the relief pattern may be optionally rinsed using deionized water and dried by spinning, baking on a hot plate, in an oven, or other suitable means.

The benzoxazole ring is then formed by curing of the uncured relief pattern to obtain the final high heat resistant pattern. Curing is performed by baking the developed, uncured relief pattern at or above the glass transition temperature $T_g$ of the photosensitive composition to obtain the benzoxazole ring that provides high heat resistance. Typically, temperatures above about 200° C. are used.

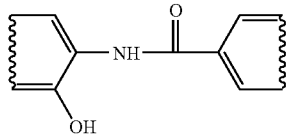

↓ Δ

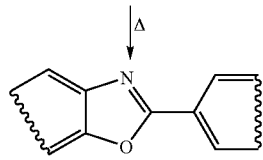

Formation of polybenzoxazole ring

Preferably, temperatures from about 250° C. to about 400° C. are applied. The curing time is from about 15 minutes to about 24 hours depending on the particular heating method employed. A more preferred range for the curing time is from about 20 minutes to about 5 hours and the most preferred range of curing time is from about 30 minutes to about 3 hours. Curing can be done in air or preferably, under a blanket of nitrogen and may be carried by any suitable heating means. Preferred means include baking on a hot plate, a convection oven, tube furnace, vertical tube furnace, or rabid thermal processor. Alternatively, curing bay be effected by the action of microwave or infrared radiation.

Another embodiment of this patent is directed to a heat resistant negative working photosensitive composition that comprises:

(a) one or more polybenzoxazole precursor polymers of Structures I or III or III* having a carbonyl, carbonyloxy or sulfonyl group; G* is a divalent organic group having at least one carbonyl or sulfonyl group;

(b) at least one compound having Structure VI

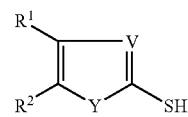

VI wherein, V is CH or N, Y is O or $NR^3$ wherein $R^3$ is H, $CH_3$ or $C_2H_5$, $R^1$ and $R^2$ each independently are H, $C_1$-$C_4$ alkyl group, $C_1$-$C_4$ alkoxy group, cyclopentyl or cyclohexyl, alternatively, $R^1$ and $R^2$ can be fused to produce a substituted or unsubstituted benzene ring;

(c) at least one solvent, (d) at least one photoactive compound which releases acid upon irradiation (PAG); and (e) at least one latent crosslinker each of which contains at least two $\sim\!N\!\!-\!\!(CH_2OR^{29})_a$ units where a=1 or 2, and $R^{29}$ is a linear or branched $C_1$-$C_8$ alkyl group.

The negative-working photosensitive composition has one or more polybenzoxazole precursors comprising the Structure I or III or III* as described earlier.

The negative-working photosensitive composition of this invention comprises at least one compound having Structure VI:

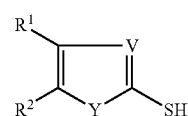

VI

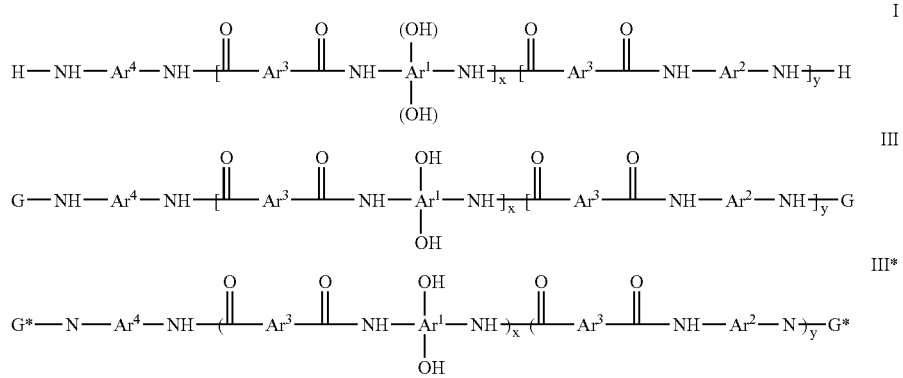

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon; $Ar^3$ is a divalent aromatic group, a divalent aliphatic group, a divalent heterocyclic group, or mixtures thereof; $Ar^4$ is $Ar^1(OH)_2$ or $Ar^2$, x is from about 10 to about 1000; y is from 0 to about 900 and G is a monovalent organic group wherein, V is CH or N, Y is O or NR wherein R is H, $CH_3$ or $C_2H_5$, $R^1$ and $R^2$ each independently are H, $C_1$-$C_4$ alkyl group, $C_1$-$C_4$ alkoxy group, cyclopentyl or cyclohexyl, or alternatively, $R^1$ and $R^2$ can be fused to produce a substituted or unsubstituted benzene ring, Compounds generally described by Structure VI can also exist (and may preferentially exist) in the tautomeric form VI' in certain situations. For the purposes of the description of this invention, both tautomeric forms are considered to be described by Structure VI.

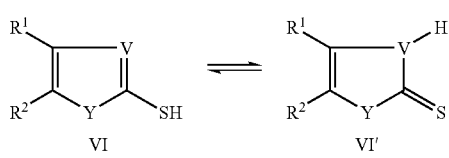

Preferred compounds having Structure VI include, but are not limited to Structures VI-a or VI-b or VI-c or VI-d:

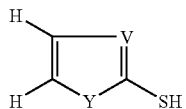

VI-a

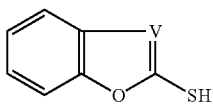

VI-b

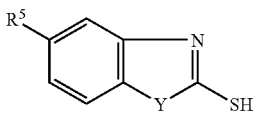

VI-c

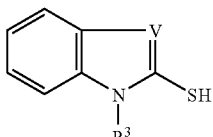

VI-d wherein, the definitions of V, Y and $R^3$ are the same as defined earlier, and $R^5$ is H or an electron donating group. Examples of electron donating groups include, but are not limited to, a $C_1$-$C_4$ alkyl group, a. $C_1$-$C_4$ alkoxy group, cyclopentyl and cyclohexyl. In the alternative tautomeric form, preferred compounds VI-a-VI-d would be

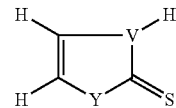

VI'-a

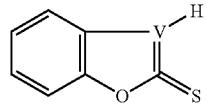

VI'-b

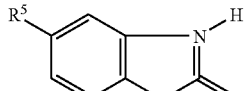

VI'-c

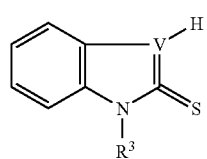

VI'-d

Examples of compounds having Structure VI include, but are not limited to:

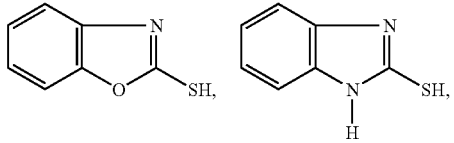

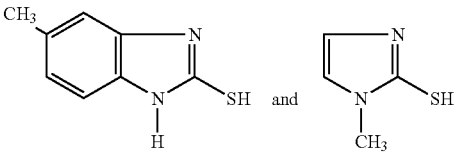

The negative-working photosensitive composition has one or more solvents. The solvent(s) should not interfere with the photoacid generation from PAG or with the acid-catalyzed crosslinking reaction, should dissolve all components and should cast a good film. Suitable solvents include, but are not limited to, polar organic solvents, such as gamma-butyrolactone (GBL), propylene glycol methyl ether acetate (PG-MEA), methoxy ethyl ether and mixtures thereof. The preferred solvent is gamma-butyrolactone.

The negative-working photosensitive composition of the present invention uses photoactive compounds that release acid upon irradiation. Such materials are commonly called Photo-Acid Generators (PAGs). PAGs of the present invention are preferably active to radiation with wavelengths between about 300 nm to about 460 nm. They should form a homogeneous solution in the photosensitive composition and produce strong acid upon irradiation. Examples of such acids include hydrogen halides or a sulfonic acid. The classes of such PAGs include, but are not limited to, oxime sulfonates, triazides, diazoquinone sulfonates, or sulfonium or iodonium salts of sulfonic acids. Examples of suitable PAGs include but are not limited to:

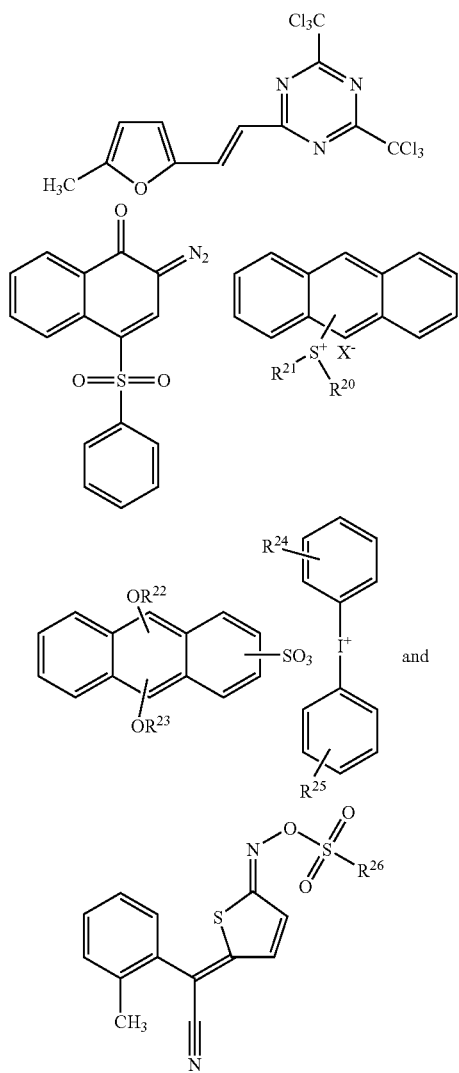

where $R^{20}$ and $R^{21}$ are each independently linear, branched or cyclic alkyl or aryl group containing 1 to 20 carbon atoms and $X^-$ is $R^{27}SO_3^-$, $R^{27}$ is a substituted or unsubstituted, linear, branched or cyclic $C_1$-$C_{25}$ alkyl or a single or multinuclear aryl group having a total of from 6 to 25 carbons; $R^{22}$, $R^{23}$, $R^{24}$ and $R^{25}$ are each independently linear, branched or cyclic alkyl groups, and $R^{26}$ is a linear or branched $C_1$-$C_8$ alkyl, $C_5$-$C_8$ cycloalkyl, camphoroyl or toluyl.

Alternatively, acid could be generated by a combination of a PAG and a sensitizer. In such systems energy of radiation is absorbed by the sensitizer and transmitted in some manner to the PAG. The transmitted energy causes PAG decomposition and generation of photoacid. Any suitable photoacid generator compound may be used. Suitable classes of photoacid generators generating sulfonic acids include, but are not limited to, sulfonium or iodonium salts, oximidosulfonates, bis-sulfonyldiazomethane compounds, and nitrobenzylsulfonate esters. Suitable photoacid generator compounds are disclosed, for example, in U.S. Pat. Nos. 5,558,978 and 5,468,589, which are incorporated herein by reference. Other suitable photoacid generators are perfluoroalkyl sulfonyl methides and perfluoroalkyl sulfonyl imides as disclosed in U.S. Pat. No. 5,554,664.

Still other suitable examples of photoacid generators are triphenylsulfonium bromide, triphenylsulfonium chloride, triphenylsulfonium iodide, triphenylsulfonium hexafluorophosphate, triphenylsulfonium hexafluoroarsenate, triphenylsulfonium hexafluoroarsenate, triphenylsulfonium trifluoromethanesulfonate, diphenylethylsulfonium chloride, phenacyidimethylsulfonium chloride, phenacyltetrahydrothiophenium chloride, 4-nitrophenacyltetrahydrothiopheniumn chloride, and 4-hydroxy-2-methylphenylhexahydrothiopyrylium chloride.

Additional examples of suitable photoacid generators for use in this invention include triphenylsulfonium perfluorooctanesulfonate, triphenylsulfonium perfluorobutanesulfonate, methylphenyldiphenylsulfonium perfluorooctanesulfonate, methylphenyldiphenysulfonium perfluorooctanesulfonate, 4-n-butoxyphenyldiphenylsulfonium perfluorobutanesulfonate, 2,4,6-trimethylphenyldiphenylsulfonium perfluorobutanesulfonate, 2,4,6-trimethylphenyldiphenylsulfonium benzenesulfonate, 2,4,6-trimethylphenyldiphenylsulfonium 2,4,6-triisopropylbenzenesulforiate, phenylthiophenyldiphenylsulfonium 4-dodecylbenzensulfonic acid, tris(-t-butylphenyl)sulfonium perfluorooctanesulfonate, tris(-t-butylphenyl)sulfonium perfluorobutanesulfonate, tris(-t-butylphenyl)sulfonium 2,4,6-triisopropylbenzenesulfonate, tris(-t-butylphenyl)sulfonium benzenesulfonate, and phenylthiophenyldiphenylsulfonium perfluorooctanesulfonate.

Examples of suitable iodonium salts for use in this invention include, but are not limited to, diphenyl iodonium perfluorobutanesulfonate, bis-(t-butylphenyl)iodonium perfluorobutanesulfonate, bis-(t-butylphenyl)iodonium perfluorooctanesulfonate, diphenyl iodonium perfluorooctanesulfonate, bis-(t-butylphenyl)iodonium benzenesulfonate, bis-(t-butylphenyl)iodonium 2,4,6-triisopropylbenzenesulfonate, and diphenyliodonium 4-methoxybenzensulfonate.

Further examples of suitable photoacid generators for use in this invention are bis(p-toluenesulfonyl)diazomethane, methylsulfonyl p-toluenesulfonyidiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1 cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl-p-toluenesulfonate, 2,6-dinitrobenzyl-p-toluenesulfonate, and 2,4-dinitrobenzyl-p-trifluoromethylbenzenesulfonate.

Examples of sensitizers include but are not limited to: 9-methylanthracene, anthracenemethanol, acenaphthene, thioxanthone, methyl-2-naphthyl ketone, 4-acetylbiphenyl, 1,2-benzofluorene.

The latent crosslinker of this invention should contain at least two —N—(CH$_2$—OR$^{29}$)$_a$ units where a=1 or 2, and R$^{29}$ is a linear or branched $C_1$-$C_8$ alkyl group. When such Structure interacts with an acid, formed after PAG irradiation, a carbocation is believed to be formed (U.S. Pat. No. 5,512,422):

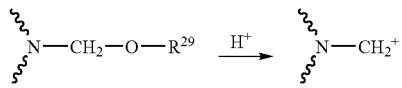

The carbocation formed from the crosslinker can then react with an OH group in a polymer chain or undergo a Friedel Crafts reaction with an aromatic ring. Reaction of two or more such sites of the crosslinker with two or more polymer chains results in crosslinks as shown in the scheme below for $R^{29}$=Me. The crosslinks render the polymer less soluble in developer and creates the solubility differential with the unexposed areas necessary for image formation. Enough crosslinkers render it insoluble.

The latent crosslinker of this invention may be a single compound, an oligomer, a polymer, or mixtures thereof each containing at least two —$N(CH_2OR^{29})_a$ groups. Such crosslinking agents may be prepared by the reaction of a variety of polyamino compounds with formaldehyde in the presence of alcohols such as methanol or butanol or in other solvents followed by an etherification step. Examples of suitable polyamino compounds include ureas, melamines, benzoguanamines, glycolurils, diguanamines, as described in U.S. Pat. No. 5,545,702, and guanidines.

Examples of suitable classes of such latent crosslinkers include but are not limited to the alkoxymethylmelamines, the alkoxymethylglycolurils, the alkoxymethylbenzoguanamines, the alkoxymethyldiguanamines derived from diguanamines as described in U.S. Pat. No. 5,545,702, and melamine or benzoguanamine polymers as described in U.S. Pat. No. 6,524,708. Specific examples of compounds having multiple —N—$(CH_2$—$OR^{29})_a$ units include but are not limited to:

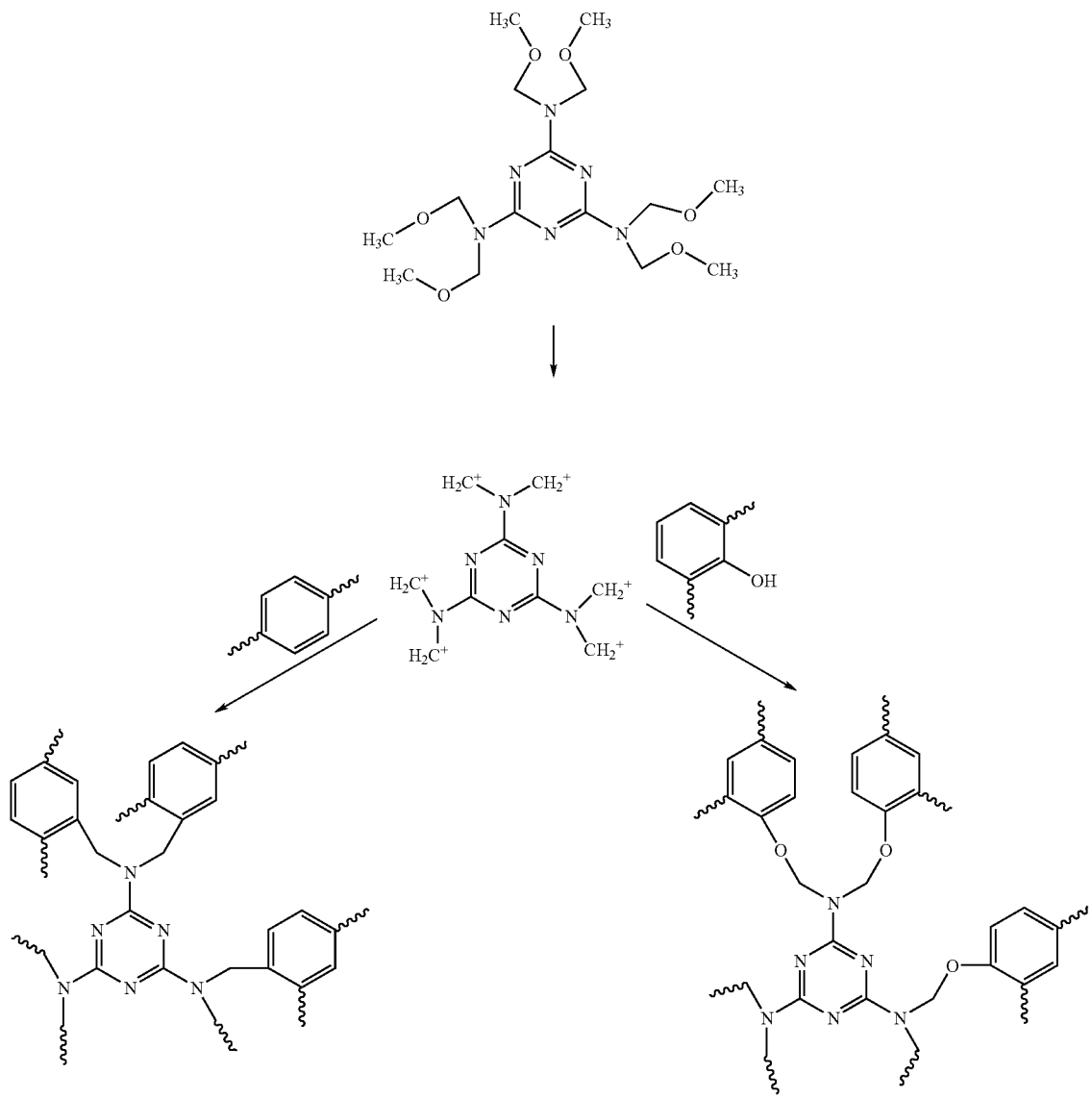

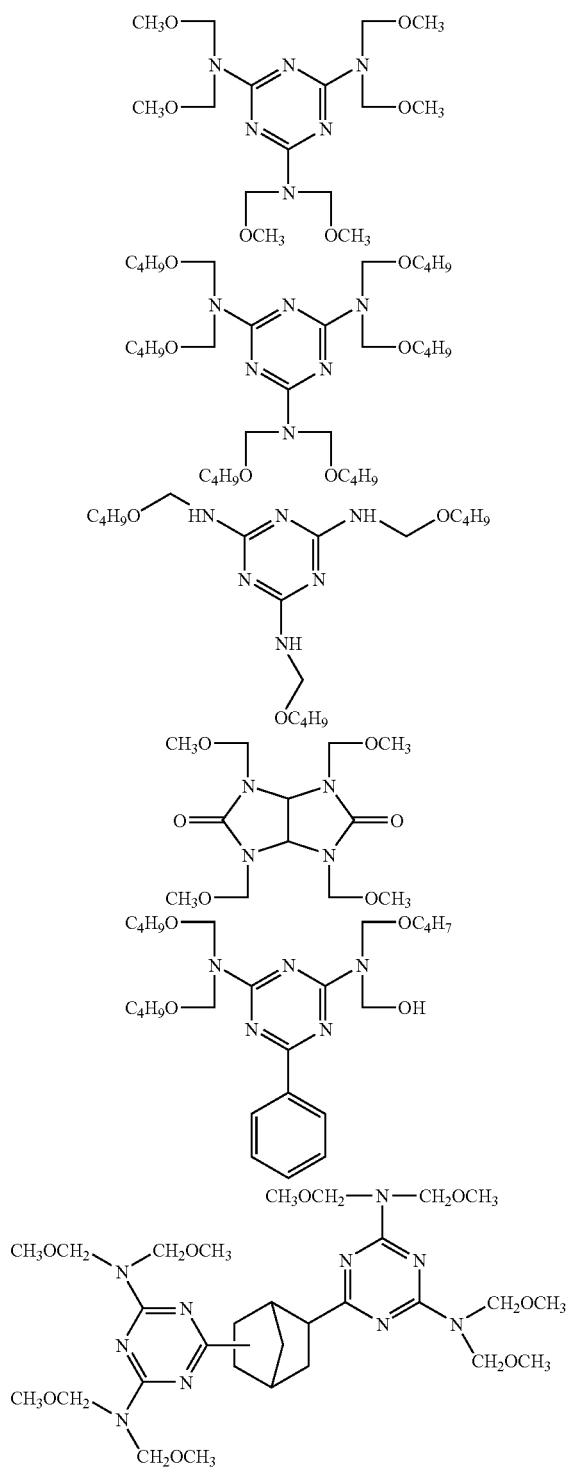

Materials having —N—(CH$_2$—OR$^{29}$)$_a$ units are available commercially from Cytec Industries, and Solutia as the Cymel™, Powderlink™, and Resimene™ series of products.

The disclosed composition can optionally have a dissolution rate modifier. When the latent crosslinker is highly reactive, the dissolution rate modifier should not contain carboxylic acid groups. The carboxylic acid groups help catalyze undesired crosslinking during the initial bake to remove solvent. This results in a low dissolution rate in the unexposed areas following lithographic processing and poorer imaging properties. In this context, a highly reactive crosslinker is defined as one which crosslinks enough during the intial bake to decrease the dissolution rate to <1 micron/minute when baked at 100° C. for 60 seconds on a hotplate. Some melamine type crosslinkers e.g. Cymel 303 are typical examples of highly reactive crosslinkers.

Other embodiments of the invention may use crosslinkers of low reactivity. To avoid poor photospeed and lithographic properties, higher bake temperature are preferred. However, those skilled in the art will recognize that PAGs of proper thermal stability must be chosen to avoid degradation of the lithographic properties caused by acid generation from thermal decomposition of the PAG. In a preferred embodiment, photosensitive compositions employing low reactivity crosslinkers also employ a dissolution rate modifier which contains carboxylic acids. Examples of low reactivity crosslinkers in this context include glyoluracils, e.g. Powderlink™ products.

The dissolution modifier is added to increase the dissolution rate in unexposed areas, promote crosslinking and improve the overall performance of the formulation. The examples of dissolution modifiers include, but are not limited to, polyols, phenolic compounds with at least two hydroxyl groups, and compounds containing carboxylic acids.

Polyols are linear, cyclic or alicyclic aliphatic materials, which have more than one hydroxy group. In addition such materials can also contain heteroatoms such as oxygen or nitrogen. Examples of polyols include, but are not limited to, ethylene glycol, diethylene glycol, polyethylene glycol, propylene glycol, tripropylene glycol, polypropylene glycol, glycerol, butane diol, hexane diol, sorbitol, cyclohexanediol, 4,8-bis(hydroxymethyl)-tricyclo(5.2.1.0/2,6)decane and a 2-oxepanone co-polymer with 2-ethyl-2-(hydroxymethyl)-1,3-propanediol.

Phenolic compounds with at least two hydroxyl groups are materials containing at least two hydroxyl groups attached to the same or different aromatic rings. The aromatic rings can be fused, connected directly or connected through one or several carbon atoms. In addition to hydroxyl groups, these aromatic rings can have other substituents such as alkyl, ether or ester groups. The molecular weight of these materials can range from about 100 to 30,000. Examples of such materials include but are not limited to: hydroquinone, 1,1,1-tris(4-hydroxyphenyl)ethane, anthrarobin, 2,7-dihydroxynaphthalene, 4,4-biphenol, 3-methoxycatechol, poly(hydroxystyrene), novolacs, and calixarenes.

The dissolution rate modifier may contain compounds containing carboxylic acid groups. Such compounds can be monomeric or polymeric in nature and contain aromatic or aliphatic moieties. Examples of such compounds include, but are not limited to the following structures:

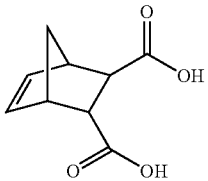

-continued

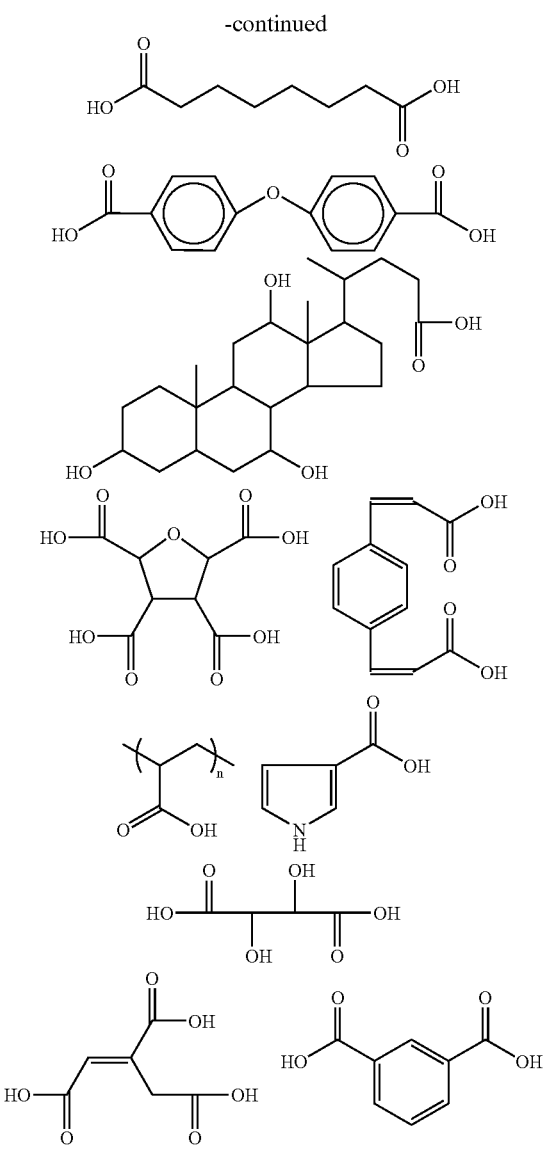

A preferred class of carboxylic acids in the present invention is polyamic acids. A preferred polyamic acid has Structure XV:

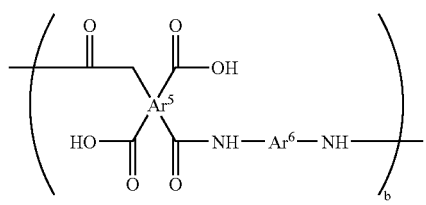

where b is an integer ranging from about 5 to about 200, and $Ar^5$ and $Ar^6$ can independently be aromatic or aliphatic, and preferably $Ar^6$ is a divalent aromatic group, a divalent heterocyclic group, a divalent alicyclic group, a divalent aliphatic group that may contain silicon, or mixtures thereof, and $Ar^5$ is a tetravalent aromatic group, a tetravalent heterocyclic group, a tetravalent cycloaliphatic group, or a tetravalent alicyclic group, with the proviso that each valence has at least one of the other valences ortho to it. A preferred range for b is from about 25 to about 175. A more preferred range for b is from about 50 to about 150. Polymer XV should be compatible with other components of the negative-working photosensitive composition and be soluble in the aqueous developer.

Examples of polymers having Structure XV are prepared by reacting monomers XVI and XVII,

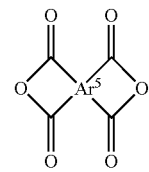   XVI

   XVII where $Ar^5$ and $Ar^6$ can independently be aromatic or aliphatic moieties with or without heteroatoms, and preferably $Ar^6$ is a divalent aromatic group, a divalent heterocyclic group, a divalent alicyclic group, a divalent aliphatic group that may contain silicon, or mixtures thereof, and $Ar^5$ is a tetravalent aromatic group, a tetravalent heterocyclic group, a tetravalent cycloaliphatic group, or a tetravalent alicyclic group, with the proviso that each valence has at least one of the other valences ortho to it. XVI can be a dianhydride of one type or a mixture of several dianhydrides, provided that the final polymer is soluble in the photosensitive composition solvent. Examples of XVI include, but are not limited to, the following dianydrides: 3,3',4,4'-biphenyltetracarboxylic acid dianhydride, 3,3',4,4' diphenylsulfidetetracarboxylic acid dianhydride, 3,3',4,4'-diphenylsulfontetracarboxylic acid dianhydride, 3,3',4,4'-benzophenone tetracarboxylic acid dianhydride, 3,3',4,4'-diphenylmethanetetracarboxylic acid dianhydride, 2,2',3,3' diphenylmethanetetracarboxylic acid dianhydride, 2,3,3',4'-biphenyltetracarboxylic acid dianhydride, 2,3,3',4'-benzophenonetetracarboxylic acid dianhydride, dianhydrides of oxydiphthalic acids, particularly 3,3',4,4'-diphenyloxidetetracarboxylic acid dianhydride (4,4'-oxydiphthalic acid dianhydride), 2,3,6,7-naphthalenetetracarboxylic acid dianhydride, 1,4,5,7-naphtnalenetetracarboxylic acid dianhydride, 2,2-bis(3,4-dicarboxyphenyl)propane dianhydride, 2,2-bis(2,3-dicarboxyphenyl)propane dianhydride, 2,2-bis(3,4-dicarboxyphenyl)hexafluoropropane dianhydride, 1,3-diphenylhexafluoropropane-3,3',4,4'-tetracarboxylic acid dianhydride, 1,4,5,6-naphthalenetetracarboxylic dianhydride, 2,2',3,3'-diphenyltetracarboxylic acid dianhydride, 3,4,9,10-perylenetetracarboxylic acid dianhydride, 1,2,4,5 naphthalenetetracarboxylic acid dianhydride, 1,4,5,8-naphthalenetetracarboxylic acid dianhydride, 1,8,9,10-phenanthrenetetracarboxylic acid dianhydride, 1,1-bis(2,3-dicarboxyphenyl)ethane dianhydride, 1,1-bis(3,4-dicarboxyphenyl)ethane dianhydride, 1,2,3,4-benzenetetracarboxylic acid dianhydride. Mixtures of dianhydrides, such as those named, may also be used.

In a preferred embodiment, dianhydride XVI comprises at least one material having one of the Structures XVIII-XX

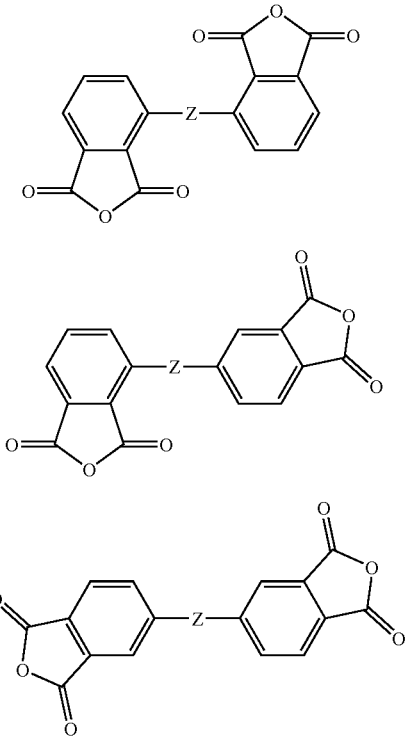

dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminidodecane, 1,12-diaminooctadecane, 2,17-diaminoeicosane, 3,3'-dimethyl-4,4'-diaminodiphenylmethane, bis(4-aminocyclohexyl) methane, bis(3-aminonorbornyl)methane, 3,3'-diaminodiphenylethane, 4,4'-diaminodiphenylethane, and 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, piperazine, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline), 3,3'sulfonyl-dianiline, 3,3'sulfonyl-dianiline, and mixtures thereof.

In a more preferred embodiment, diamine XVII comprises at least one compound with the Structure XXI

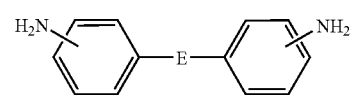

where Z=—O—, —S—, —C(CF$_3$)$_2$—, —CH$_2$—, —SO$_2$—, —NHCO— or —Si(R$^{11}$)$_2$—, R$^{11}$ is a linear branched or cyclic alkyl group containing up to 8 carbon atoms. In another preferred embodiment, Z=—O—.

In a more preferred embodiment, at least 80% of the total amount of dianhydride of Formula XVI comprises anhydrides described by Structures XVIII-XX where Z=—O—. In the most preferred embodiments, the dianhydride of XVIII are 3,3',4,4'-diphenyloxidetetracarboxylic acid dianhydride (4,4'-oxydiphthalic acid dianhydride, ODPA) or mixture of 95-85% of ODPA and 5-15% of 1,2,4,5 benzenetetracarboxylic dianhydride (PMDA).

The diamine monomer of Structure XVII can be a single diamine or a mixture of two or more diamines provided that the final polymer is soluble in the photosensitive composition solvent. Examples of XVII include, but are not limited to, the following diamines, which can be used individually or as a part of mixture: 5(6)-diamino-1-(4-aminophenyl)-1,3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 3,3'-diaminodiphenylmethane, 4,4'-diaminodiphenylmethane, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis(4-aminophenoxy)benzene, 1,3-bis(3-amino-phenoxy) benzene, 1,4-bis(γ-aminopropyl)tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5- where E=—O—, —S—, —C(CF$_3$)$_2$—, —CH$_2$—, —SO$_2$—, —NHCO— or —Si(R$^{28}$)$_2$—, and R$^{28}$ is linear branched or cyclic alkyl group containing up to 8 carbon atoms.

A diamine described by Structure XXI where E is —O— is a preferred diamine. In a more preferred embodiment this diamine comprises more than 80% of the total amount of diamine XVII. The most preferred diamine XVII is 4,4'-diaminodiphenyl ether.

A preferred polyamic acid polymer of Structure XV comprises a polymer synthesized from a dianhydride or dianhydrides of Structure XVIII, IXX or XX and a diamine or diamines of Structure XVII. A more preferred polyamic acid polymer comprises a polyamic acid polymer synthesized from a dianhydride or dianhydrides of Structure XVIII, IXX or XX where Z=—O— and a diamine or diamines of Structure XXI where E=—O—. Examples of preferred polymers of the present invention are polyamic acid polymers synthesized from 4,4'-diaminodiphenyl ether and 3,3',4,4'-diphenyloxidetetracarboxylic acid dianhydride (4,4'-oxydiphthalic acid dianhydride, ODPA) and a polyamic acid polymer synthesized from 4,4'-diaminodiphenyl ether and a mixture of 95-85% of ODPA and 5-15% of 1,2,4,5-benzenetetracarboxylic dianhydride (PMDA).

Polymers having Structure XV are prepared by reacting monomers XVI and XVII. The ratio of XVII/XVI may be from about 0.90 to about 1. A preferred ratio of XVII/XVI is from about 0.92 to about 0.99. A more preferred ratio of XVII/XVI is from about 0.95 to about 0.98. The reaction time is from about an hour to about 48 hours. A preferred reaction time is from about 2 hours to about 24 hours. A more preferred reaction time is from about 6 hours to about 20 hours. The reaction temperature is from about −20° C. to about 60° C. A preferred reaction temperature is from about −10° C. to about 50° C. A more preferred reaction temperature is from about 0°

C. to about 45° C. The polyamic acid can be prepared in situ and the solution added to the composition or it can be first isolated by precipitation into a non-solvent. Examples of suitable non-solvents include de-ionized water or a mixture of de-ionized water and an alcohol such as methanol or isopropyl alcohol. The ratio of de-ionized water to alcohol can vary from about 99/1 to about 10/90. A more preferred ratio of de-ionized water to alcohol is from about 90/10 to about 25/75. A more preferred ratio is from about 75/25 to about 25/75.

The amount of polybenzoxazole precursor polymer I and/or III and/or III* in the photosensitive composition of the present invention can range from about 10 wt % to about 50 wt % of the total formulation. In a preferred embodiment, the content of I and/or III and/or III* is from about 25 wt % to about 40 wt %. In a more preferred embodiment, the content of I and/or III and/or III* is from about 25 wt % to about 35 wt % of total formulation.

The amount of compound(s) having Structure VI used in this composition is from about 0.06 wt. % to about 9 wt. % based on amount of the polybenzoxazole, preferably, from about 0.15 wt. % to about 6 wt. %, and most preferably, from about 0.18 wt. % to about 3 wt. % based on amount of the polybenzoxazole.

The amount of solvent in the formulation of the photosensitive composition of the invention can be from about 45 wt % to about 87 wt % of the total weight. A preferred amount is from about 48 wt % to about 75 wt %. A more preferred amount is from about 50 wt % to about 65 wt %.

The amount of PAG in the photosensitive composition of the present invention ranges from about 0.5 wt % to about 20 wt % based on amount of the polybenzoxazole precursor polymer. A preferred concentration range of PAG is from about 2 wt % to about 15 wt % based on the amount of polybenzoxazole precursor polymer. A more preferred concentration range of PAG is from about 2.5 wt % to about 10 wt % based on the amount of polybenzoxazole precursor polymer. A most preferred concentration range of PAG is from about 3 wt % to about 7 wt % based on the amount of polybenzoxazole precursor polymer. The amount of optional sensitizer can be from about 0.1 to about 5 wt % based on the amount of polybenzoxazole precursor polymer.

The amount of latent crosslinker in the photosensitive composition of the present invention can be about 2 wt % to about 35 wt % based on amount of polybenzoxazole precursor polymer. A preferred amount of crosslinker is from about 5 wt % to about 25 wt % based on amount of polybenzoxazole precursor polymer. A more preferred concentration range of crosslinker is from about 5 to about 20 wt % based on the amount of polybenzoxazole precursor polymer. A most preferred concentration range of crosslinker is from about 5 to about 15 wt % based on the amount of polybenzoxazole precursor polymer.

The amount of dissolution rate modifier, if present, can be from about 1 wt % to about 20 wt % based on the amount of polybenzoxazole precursor polymer. If a polyol compound is employed, a preferred amount is from about 5 wt % to about 20 wt % based on the amount of polybenzoxazole precursor polymer. A more preferred amount of polyol compound is from about 5 wt % to about 15 wt % based on the amount of polybenzoxazole precursor polymer. A most preferred amount of polyol compound is from about 8 wt % to about 12 wt % based on the amount of polybenzoxazole precursor polymer. If a phenolic compound is employed, a preferred amount is from about 5 wt % to about 20 wt % based on the amount of polybenzoxazole precursor polymer. A more preferred amount of phenolic compound is from about 5 wt % to about 15 wt % based on the amount of polybenzoxazole precursor polymer. A most preferred amount of phenolic compound is from about 8 wt % to about 12 wt % based on the amount of polybenzoxazole precursor polymer. If a compound containing carboxylic acid groups is employed, then a preferred amount is from about 2 wt % to about 15 wt % based on the amount of polybenzoxazole precursor polymer. A more preferred amount of carboxylic acid compound is from about 2% to about 10% based on the amount of polybenzoxazole precursor polymer. A most preferred amount of carboxylic acid compound is form about 2 wt % to about 5 wt % based on the amount of polybenzoxazole precursor polymer.

The negative working photosensitive composition of the present invention can also contain other additives. Examples of suitable additives include, but are not limited to, dyes, surfactants and adhesion promoters.

If employed, the amount of adhesion promoter may range from about 0.1 wt. % to about 5 wt. % based on the amount of polybenzoxazole precursor polymer. A preferred amount of adhesion promoter is from about 1 wt. % to about 5 wt. % based on the amount of polybenzoxazole precursor polymer. A more preferred amount of adhesion promoter is from about 2 wt. % to about 4 wt. % based on the amount of polybenzoxazole precursor polymer. Suitable adhesion promoters include, for example, amino silanes, and mixtures or derivatives thereof. Examples of suitable adhesion promoters which may be employed in the invention may be described by Structure XIV

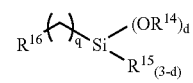

wherein each $R^{14}$ is independently a $C_1$-$C_4$ alkyl group or a $C_5$-$C_7$ cycloalkyl group, each $R^{15}$ is independently a $C_1$-$C_4$ alkyl group, a $C_1$-$C_4$ alkoxy group, a $C_5$-$C_7$ cycloalkyl group or a $C_5$-$C_7$ cycloalkoxy group, d is an integer from 0 to 3 and q is an integer from 1 to about 6, $R^{16}$ is one of the following moieties:

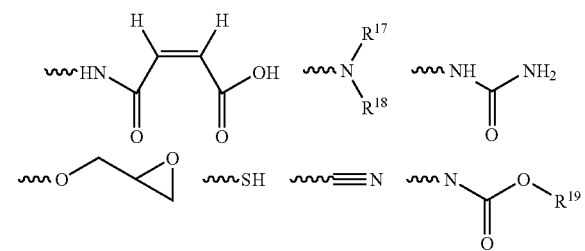

wherein each $R^{17}$ and $R^{18}$ are independently a $C_1$-$C_4$ alkyl group or a $C_5$-$C_7$ cycloalkyl group, and $R^{19}$ is a $C_1$-$C_4$ alkyl group or a $C_5$-$C_7$ cycloalkyl group. Preferred adhesion promoters are those wherein $R^{16}$ is selected from

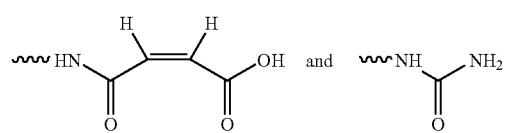

More preferred adhesion promoters are those wherein $R^{16}$ is

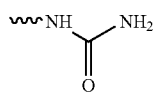

The most preferred adhesion promoters are

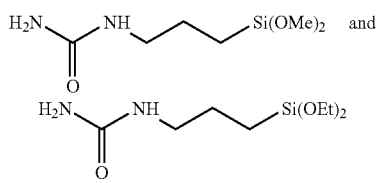

In another embodiment, the present invention includes a process for forming a negative tone relief image. The process comprises the steps of:
(a) providing a substrate,
(b) coating on said substrate, a negative-working photosensitive composition comprising one or more polybenzoxazole precursors having the Structure I or III or III*, at least one compound having Structure VI, at least one solvent, at least one photoactive compound which releases acid upon irradiation, at least one latent crosslinker each of which contains at least two ~N—(CH$_2$OR$^{29}$)$_a$ units where a=1 or 2, and wherein $R^{29}$ is a linear or branched C$_1$-C$_8$ alkyl group), and optionally at least one dissolution rate modifier (all as described above), with the proviso that when the latent crosslinker is highly reactive, the dissolution rate modifier does not contain carboxylic acid groups, thereby forming a coated substrate;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

The negative acting, photoactive composition of this invention is coated on a suitable substrate. The substrate may be, for example, semiconductor materials such as a silicon wafer, compound semiconductor (III-V) or (II-VI) wafer, a ceramic, glass or quarz substrate. Said substrates may also contain films or structures used for electronic circuit fabrication such as organic or inorganic dielectrics, copper or other wiring metals. The preferred substrate for this invention is a wafer containing exposed copper.

Methods to coat the substrate with the photosensitive resin composition include, but are not limited to, spray coating, spin coating, offset printing, roller coating, screen printing, extrusion coating, meniscus coating, curtain coating, and immersion coating.

To ensure proper adhesion of the photosensitive composition to the substrate the substrate may be optionally treated before coating with an (external) adhesion promoter before the first coating step or the photosensitive composition may employ an internal adhesion promoter. Any suitable method of treatment of the substrate with adhesion promoter known to those skilled in the art may be employed. Examples include treatment of the substrate with adhesion promoter vapors, solutions or at 100% concentration. The time and temperature of treatment will depend on the particular substrate, adhesion promoter, and method, which may employ elevated temperatures. Any suitable external adhesion promoter may be employed. Classes of suitable external adhesion promoters include but are not limited to vinylalkoxysilanes, methacryloxyalkoxyysilanes, mercaptoalkoxysilanes, aminoalkoxysilanes, epoxyalkoxysilanes and glycidoxyalkoxysilanes. Aminosilanes and glycidoxysilanes are more preferred. Primary aminoalkoxysilanes are more preferred. Examples of suitable external adhesion promoters include, but are not limited to gamma-aminopropyltrimethoxysilane, gamma-glycidoxypropylmethyldimethoxysilane, gamma-glycidoxypropylmethyldiethoxysilane, gamma-mercaptopropylmethyldimethoxysilane, 3-methacryloxypropyldimethoxymethylsilane, and 3-methacryloxypropyltrimethoxysilane. gamma-Aminopropyltrimethoxysilane is more preferred. Additional suitable adhesion promoters are described in "Silane Coupling Agent" Edwin P. Plueddemann, 1982 Plenum Press, New York.

The resulting film is optionally prebaked at an elevated temperature. The bake may be completed at one or more temperatures within the temperature bake of from about 70° C. to about 150° C. for several minutes to half an hour, depending on the method, to evaporate the remaining solvent. Any suitable baking means may be employed. Examples of suitable baking means include, but are not limited to, hot plates and convection ovens.

Subsequently, the resulting film is exposed to actinic rays in a preferred pattern through a mask. X-rays, electron beam, ultraviolet rays, visible light, and the like can be used as actinic rays. The most preferable rays are those with wavelength of 436 nm (g-line) and 365 nm (i-line).

Following exposure to actinic radiation, the exposed and coated substrate is heated to a temperature between about 70° C. and about 150° C. The exposed and coated substrate is heated in this temperature range for a short period of time, typically several seconds to several minutes and may be carried out using any suitable heating means. Preferred means include baking on a hot plate or in a convection oven. This process step is commonly referred to in the art as post exposure baking.

Next, the film is developed using an aqueous developer and a relief pattern is formed. The aqueous developer contains aqueous base. Examples of suitable bases include, but are not limited to, inorganic alkalis (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1% to about 5%. Development can be carried out by means of immersion, spray, puddling, or other similar developing methods at temperatures from about 10° C. to about 40° C. for about 30 seconds to about 5 minutes. After development, the relief pattern may be optionally rinsed using de-ionized water and dried by spinning, baking on a hot plate, in an oven, or other suitable means.

The benzoxazole ring is then formed by curing of the uncured relief pattern to obtain the final high heat resistant pattern. Curing is performed by baking the developed, uncured relief pattern at, or above, the glass transition temperature $T_g$ of the photosensitive composition to obtain the benzoxazole ring that provides high heat resistance as described before.

The invention is illustrated by, but not limited to, the following examples in which the parts and percentages are by weight unless otherwise specified.

SYNTHESIS EXAMPLE 1

Synthesis of Polybenzoxazole Precursor Polymer of Structure (Ia)

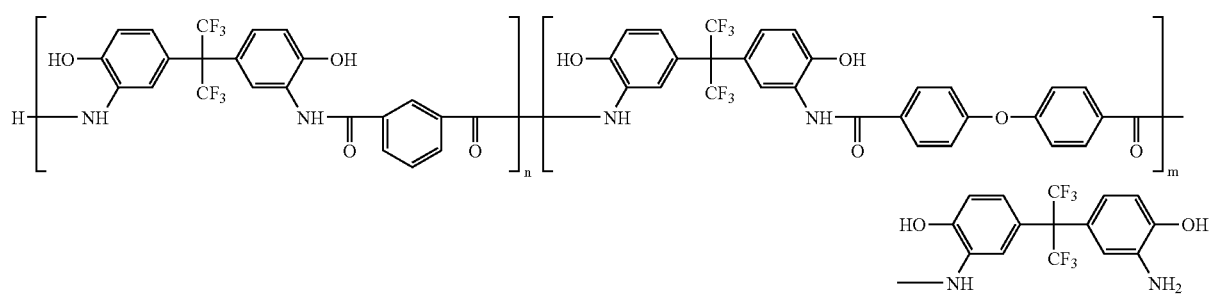

To a 2 L, three-necked, round bottom flask equipped with a mechanical stirrer, nitrogen inlet and addition funnel, 155.9 g (426.0 mmol) of hexafluoro-2,2-bis(3-amino-4-hydroxyphenyl)propane (BisAPAf), 64.3 g (794.9 mmol) of pyridine, and 637.5 g of N-methylpyrrolidone (NMP) were added. The solution was stirred at room temperature until all solids dissolved, and then cooled in an ice water bath at 0-5° C. To this solution, 39.3 g (194 mmol) of isophthaloyl chloride, and 56.9 g (194 mmol) of 1,4-oxydibenzoyl chloride dissolved in 427.5 g of NMP, were added drop-wise. After the addition was completed, the resulting mixture was stirred at room temperature for 18 hours. The viscous solution was precipitated in 10 liters of vigorously stirred de-ionized water. The polymer was collected by filtration and washed with de-ionized water and a water/methanol (50/50) mixture. The polymer was dried under vacuum conditions at 105° C. for 24 hours.

The yield was almost quantitative and the inherent viscosity (iv) of the polymer was 0.20 dL/g measured in NMP at a concentration of 0.5 g/dL at 25° C.

The number average molecular weight (Mn) was determined by gel permeation chromatography using four Phenogel 10 columns with pore sizes of $10^4$ A, 500 A, 100 A and 50 A and THF as an eluent. Polystyrene standards were used for calibration. The typical Mn for a polymer prepared by the above procedure was 5,800.

SYNTHESIS EXAMPLE 2

Synthesis of Polybenzoxazole Precursor Polymer of Structure (IIa)

To a 1 L three-necked round bottom flask equipped with a mechanical stirrer, 54.2 g (100 mmol) of the polymer obtained in Synthesis Example 1 and 500 mL of tetrahydrofuran (THF) were added. The mixture was stirred for ten minutes and the solid was fully dissolved. 0.81 g (3 mmole) of 5-naphthoquinone diazide sulfonyl chloride (S-215-Cl) was then added and the mixture was stirred for another 10 minutes. Triethylamine, 0.3 g (3 mmol), was added gradually within 15 minutes and then the reaction mixture was stirred for 5 hours. The reaction mixture was then added gradually to 5000 mL of vigorously stirred de-ionized water. The precipitated product was separated by filtration and washed with 2 L of de-ionized water. To the product was added another 6 L de-ionized water and the mixture vigorously stirred for 30 minutes. After filtration the product was washed with 1 L de-ionized water. The isolated product was dried at 40° C. overnight. The yield was almost quantitative The inherent viscosity of the polymer was 0.21 dL/g measured in NMP at the concentration of 0.5 g/dL at 25° C.

SYNTHESIS EXAMPLE 3

Synthesis of a Photoactive Compound (PAC) of Structure (XIII p)

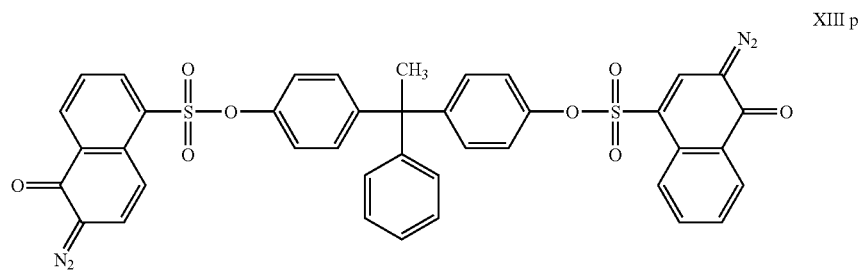

To a 500 mL, 3-neck flask equipped with mechanical stirrer, dropping funnel, pH probe, thermometer and nitrogen purge system were added 225 mL of THF and 30 g of (4,4'-(1-phenylethylidene)bisphenol), Bisphenol AP. The mixture was stirred until bisphenol AP was fully dissolved. To this was added 27.75 g of 4-naphthoquinone diazide sulfonyl chloride (S-214-Cl) and 25 mL of THF. The reaction mixture was stirred until the solid was fully dissolved. 10.475 g of triethylamine dissolved in 50 mL THF was added to the reaction mixture gradually while the pH was kept under 8 during this process. The temperature during this exothermic reaction was kept under 30° C. Upon completion of addition, the reaction mixture was stirred for 48 hours. To this was added 27.75 g of 5-naphthoquinone diazide sulfonyl chloride (S-215 Cl) and 25 mL of THF and the reaction mixture was stirred for 30 minutes. 10.475 g triethylamine dissolved in 50 mL THF was added to the reaction mixture gradually while the pH was kept under 8 during this process. Again during this exothermic reaction the temperature was kept under 30° C. Upon completion of the addition, the reaction mixture was stirred for 20 hours. The reaction mixture was then added gradually to a mixture of 6 L of DI-water and 10 g of HCl. The product was filtered and washed with 2 L of de-ionized water. The product was then reslurried by using 3 L of de-ionized water, filtered and washed with 1 L Of de-ionized water. The product was then dried inside a vacuum oven at 40° C. until the amount of water dropped below 2%. HPLC analysis revealed that the product was a mixture of several esters as shown in Table 1.

TABLE 1

| Structure | DNQ moiety | Example 3 |
| --- | --- | --- |
| [naphthoquinone diazide sulfonyl chloride structure] | S214 | 0.61% |
| [naphthoquinone diazide sulfonyl chloride structure] | S215 | 0.53% |
| [bisphenol AP S214 monoester structure] | S214 monoester | 1.72% |
| [bisphenol AP S215 monoester structure] | S215 monoester | 1.4% |
| [bisphenol AP S215 diester structure] | S215 diester | 18.9% |

| Structure | | |
|---|---|---|
| ![DNQ structure] | DNQ moiety | Example 3 |
| ![Mixed Ester PAC structure] | Mixed Ester PAC | 46.7% |
| ![S214 diester structure] | S214 diester | 29% |

SYNTHESIS EXAMPLE 4

Synthesis of a Photoactive Compound (PAC) of Structure (XIII p')

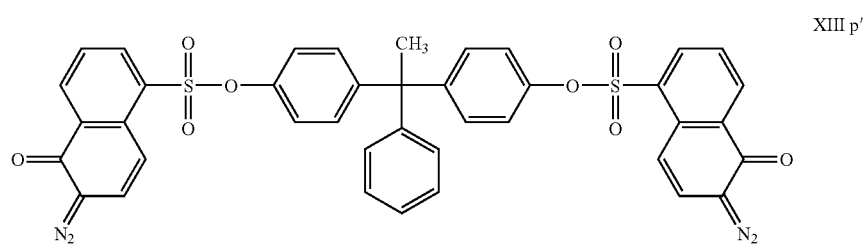

XIII p'

The reaction was similar to that of Synthesis Example 3 except 4-naphthoquinone diazide sulfonyl chloride (S-214-Cl) was omitted. HPLC analysis revealed that about 94% of the product was diester and 6% was monoester.

EXAMPLE 1

100 parts of the polymer obtained in Synthesis Example 2, 1.53 parts is of gamma-ureidopropyltrimethoxysilane, 2.48 parts of diphenylsilanediol, 13.51 parts of PAC synthesized in Example 3 and 7 parts of 2-mercaptobenzoxazole were dissolved in 175 parts GBL and filtered. The formulation was spin coated on a copper wafer then baked on a hotplate for 4 minutes at 120° C., resulting in a film thickness of 11.22 μm. The film was then exposed utilizing an i-line stepper in a patterned exposure array, which incrementally increased exposure energy 30 mJ/cm² with a starting exposure energy of 300 mJ/cm². The exposed film was then developed using two 30 second puddles with a 2.38% TMAH solution of water. The patterned copper wafers were then scratched with a pair of tweezers so as to peel off any material down to the copper substrate. The scratch was then analyzed under a microscope concentrating on areas were the scratch dissected exposed patterns. This scratching technique allowed differentiation between the substrate (bare copper) and any residue remaining in the exposed area. No residue was observed. The formulation without 2-mercaptobenzoxazole showed a heavy residue of material remaining in the exposed areas (see Comparative Example 1).

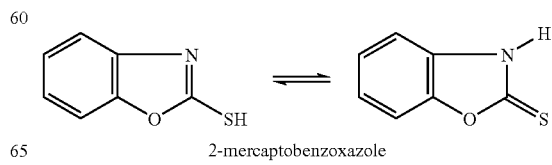

2-mercaptobenzoxazole

EXAMPLES 2-7 AND COMPARATIVE EXAMPLES 1-3

Examples 2-7 and Comparative Examples 1-3 had the same composition as Example 1 except the amount of 2-mercaptobenzoxazole varied in each formulation. A process similar to that described in Example 1 was employed for each composition. The results are shown in Table 2.

TABLE 2

| Example No. | Amount of 2-mercapto-benzoxazole (wt. percent of total composition) | Residue after pattern |
|---|---|---|
| 2 | 1.33 | No |
| 3 | 0.66 | No |
| 4 | 0.33 | No |
| 5 | 0.17 | No |
| 6 | 0.08 | No |
| 7 | 0.07 | No |
| Comp. Ex. 1 | 0 | Yes |
| Comp. Ex. 2 | 0.02 | Yes |
| Comp. Ex. 3 | 0.04 | Yes |

Examples 8 to 11 demonstrated that the copper compatible compositions of Examples 4-7 can be used on other substrates such as silicon. Each composition had maintained good photospeed.

EXAMPLE 8

The composition of Example 4 was spin coated on a silicon wafer and baked on a hotplate for 4 minutes at 120° C., resulting in a film thickness of 10.96 μm. The film was then exposed utilizing an i-line stepper in a patterned exposure array, which incrementally increased exposure energy 5 mJ/cm$^2$ with a starting exposure energy of 215 mJ/cm$^2$. The exposed film was then developed using two 30 second puddles with a 2.38% TMAH solution of water. The exposure energy required to clear all the material from an exposed area was observed and reported as $E_0$=263 mJ/cm$^2$. The unexposed film thickness after development was 6.43 μm.

EXAMPLE 9

The composition of Example 5 was spin coated on a silicon wafer and baked on a hotplate for 4 minutes at 120° C., resulting in a film thickness of 11.07 μm. The film was then exposed utilizing an i-line stepper in a patterned exposure array, which incrementally increased exposure energy 5 mJ/cm$^2$ with a starting exposure energy of 215 mJ/cm$^2$. The exposed film was then developed using two 30 second puddles with a 2.38% TMAH solution of water. The exposure energy required to clear all the material from an exposed area was observed and reported as $E_0$=294 mJ/cm$^2$. The unexposed film thickness after development was 6.74 μm.

EXAMPLE 10

The composition of Example 6 was spin coated on a silicon wafer and baked on a hotplate for 4 minutes at 120° C., resulting in a film thickness of 11.06 μm. The film was then exposed utilizing an i-line stepper in a patterned exposure array, which incrementally increased exposure energy 5 mJ/cm$^2$ with a starting exposure energy of 215 mJ/cm$^2$. The exposed film was then developed using two 30 second puddles with a 2.38% TMAH solution of water. The exposure energy required to clear all the material from an exposed area was observed and reported as $E_0$=315 mJ/cm$^2$. The unexposed film thickness after development was 6.83 μm.

EXAMPLE 11

The composition of Example 7 was spin coated on a silicon wafer and baked on a hotplate for 4 minutes at 120° C., resulting in a film thickness of 10.91 μm. The film was then exposed utilizing an i-line stepper in a patterned exposure array, which incrementally increased exposure energy 5 mJ/cm$^2$ with a starting exposure energy of 215 mJ/cm$^2$. The exposed film was then developed using two 30 second puddles with a 2.38% TMAH solution of water. The exposure energy required to clear all the material from an exposed area was observed and reported as $E_0$=312 mJ/cm$^2$. The unexposed film thickness after development was 6.78 μm.

COMPARATIVE EXAMPLES 4-7

Comparative Examples 4-7 had the same composition as Example 1 except various amounts of 2-mercaptobenzothiazole were used in these formulations instead of 2-mercaptobenzoxazole. A process similar to that described in Example 1 was employed for each composition. The results are shown in Table 3.

TABLE 3

2-mercaptobenothiazole

| Comparative Example No. | Amount of 2-mercaptobenzothiazole (wt. percent of total composition) | Residue after pattern |
|---|---|---|
| 4 | 2.66 | Yes |
| 5 | 1.33 | Yes |
| 6 | 0.67 | yes |
| 7 | 0.33 | yes |

This is surprising that 2-mercaptobenzoxazole can prevent residue when the amount used is as low as 0.07% of the total formulation while 2-mercaptobenzothiazole cannot prevent the residue formation at levels as high as 2.66% of the total formulation.

EXAMPLE 12

100 parts of the polymer obtained in Synthesis Example 2, 3 parts of gamma-ureidopropyltrimethoxysilane, 5 parts of diphenylsilanediol, 11.9 parts of PAC synthesized in Example 4 and 2 parts of 2-mercaptobenzoxazole were dissolved in 175 parts GBL and filtered. The formulation was spin coated on a copper wafer and baked on a hotplate for 4 minutes at 120° C., resulting in a film thickness of 10.95 μm. The film was then exposed utilizing an i-line stepper in a patterned exposure array, which incrementally increased exposure energy 30 mJ/cm$^2$ with a starting exposure energy of 300 mJ/cm$^2$. The exposed film was then developed using two 30 second puddles with a 2.38% TMAH solution of water. The patterned copper wafers were then scratched with a pair of tweezers so as to peel off any material down to the copper substrate. The scratch was then analyzed under a microscope concentrating on areas were the scratch dissected exposed patterns. No residue was observed.

EXAMPLES 13-15 AND COMPARATIVE EXAMPLES 8-10

Examples 13-15 and Comparative Examples 8-10 had the same composition as Example 12 except the amount of 2-mercaptobenzoxazole varied in each formulation. A process similar to that described in Example 12 was employed for each composition. The results are shown in Table 4.

TABLE 4

| Example No. | Amount of 2-mercapto-benzoxazole (wt. percent of total composition) | Residue after pattern |
|---|---|---|
| 13 | 0.33 | No |
| 14 | 0.17 | No |
| 15 | 0.08 | No |
| Comp. Ex. 8 | 0 | Yes |
| Comp. Ex. 9 | 0.02 | Yes |
| Comp. Ex. 10 | 0.04 | Yes |

EXAMPLES 16-19

Examples 16-19 had the same composition as Example 1 except different amounts of 2-mercapto-5-methylbenzimidazole were used instead of 2-mercaptobenzoxazole. A process similar to that described in Example 1 was employed for each composition. The results are shown in Table 5.

TABLE 5

2-mercapto-5-methylbenzimidazole

| Example No. | Amount of 2-mercapto-5-methylbenzimidazole (wt. percent of total composition) | Residue after pattern |
|---|---|---|
| 16 | 0.58 | No |
| 17 | 0.33 | No |
| 18 | 0.17 | No |
| 19 | 0.08 | No |

Examples 20 to 21 demonstrated that the copper compatible compositions of Examples 16 and 17 can be used on other substrates such as silicon. Each resist has good photospeed and excellent resolution of 2-3 μm.

EXAMPLE 20

The composition of Example 16 was spin coated on a silicon wafer and baked on a hotplate for 4 minutes at 120° C., resulting in a film thickness of 11.01 μm. The film was then exposed utilizing an i-line stepper in a patterned exposure array, which incrementally increased exposure energy 10 mJ/cm$^2$ with a starting exposure energy of 100 mJ/cm$^2$. The exposed film was then developed using two 30 second puddles with a 2.38% TMAH solution of water. The exposure energy required to clear all the material from an exposed area was observed and reported as $E_0$=240 mJ/cm$^2$. The unexposed film thickness after development was 6.20 μm.

EXAMPLE 21

The composition of Example 17 was spin coated on a silicon wafer and baked on a hotplate for 4 minutes at 120° C., resulting in a film thickness of 10.97 μm. The film was then exposed utilizing an i-line stepper in a patterned exposure array, which incrementally increased exposure energy 10 mJ/cm$^2$ with a starting exposure energy of 100 mJ/cm$^2$. The exposed film was then developed using two 30 second puddles with a 2.38% TMAH solution of water. The exposure energy required to clear all the material from an exposed area was observed and reported as $E_0$=254 mJ/cm$^2$. The unexposed film thickness after development was 6.26 μm.

EXAMPLES 22-26 AND COMPARATIVE EXAMPLES 11 AND 12

Examples 22-26 and Comparative Examples 7 and 8 had the same composition as Example 1 except different amounts of 2-mercapto-1-methylimidazole were used instead of 2-mercaptobenzoxazole. A process similar to that described in Example 1 was employed for each composition. The results are shown in Table 6.

TABLE 6

2-mercapto-1-methylimidazole

| Example No. | Amount of 2-mercapto-1-methylimidazole (wt. percent of total composition) | Residue after pattern on copper wafer |
|---|---|---|
| 22 | 1.2 | No |
| 23 | 0.67 | No |
| 24 | 0.17 | No |
| 25 | 0.08 | No |
| 26 | 0.04 | No |
| Comp. Ex. 11 | 0.02 | Yes |
| Comp. Ex. 12 | 0.01 | Yes |

Examples 27 to 29 demonstrated that the copper compatible compositions of Examples 22-24 can be used on other substrates such as silicon. Each resist maintained good photospeed.

EXAMPLE 27

The composition of Example 22 was spin coated on a silicon wafer and baked on a hotplate for 4 minutes at 120° C., resulting in a film thickness of 11.04 μm. The film was then exposed utilizing an i-line stepper in a patterned exposure array, which incrementally increased exposure energy 5 mJ/cm$^2$ with a starting exposure energy of 200 mJ/cm$^2$. The exposed film was then developed using two 30 second puddles with a 2.38% TMAH solution of water. The exposure energy required to clear all the material from an exposed area was observed and reported as $E_0$=236 mJ/cm$^2$. The unexposed film thickness after development was 6.04 μm

EXAMPLE 28

The composition of Example 23 was spin coated on a silicon wafer and baked on a hotplate for 4 minutes at 120° C., resulting in a film thickness of 11.01 μm. The film was then exposed utilizing an i-line stepper in a patterned exposure array, which incrementally increased exposure energy 5 mJ/cm$^2$ with a starting exposure energy of 200 mJ/cm$^2$. The exposed film was then developed using two 30 second puddles with a 2.38% TMAH solution of water. The exposure energy required to clear all the material from an exposed area was observed and reported as $E_0$=264 mJ/cm$^2$. The unexposed film thickness after development was 6.41 μm.

EXAMPLE 29

The composition of Example 24 was spin coated on a silicon wafer and baked on a hotplate for 4 minutes at 120° C., resulting in a film thickness of 11.10 μm. The film was then exposed utilizing an i-line stepper in a patterned exposure array, which incrementally increased exposure energy 5 mJ/cm$^2$ with a starting exposure energy of 200 mJ/cm$^2$. The exposed film was then developed using two 30 second puddles with a 2.38% TMAH solution of water. The exposure energy required to clear all the material from an exposed area was observed and reported as $E_0$=286 mJ/cm$^2$. The unexposed film thickness after development was 6.75 μm.

SYNTHESIS EXAMPLE 5

Synthesis of Polybenzoxazole Precursor Polymer of Structure (Ib)

Polymer Ib was synthesized according to procedure in Synthesis Example 1 except that 15 mole % of hexafluoro-2,2-bis(3-amino-4-hydroxyphenyl)propane was replaced by 4,4'-oxydianiline.

The yield was 95% and the inherent viscosity (iv) of the polymer was 0.242 dL/g measured in NMP at a concentration of 0.5 g/dL at 25° C.

SYNTHESIS EXAMPLE 6

Synthesis of Polybenzoxazole Precursor Polymer of Structure (Ic)

Polymer Ic was synthesized by the procedure in Synthesis Example 1 except that the ratio of 1,4-oxydibenzoyl chloride to isophthaloyl chloride changed from 1/1 to 4/1.

The yield was quantitative and the inherent viscosity (iv) of the polymer was 0.185 dL/g measured in NMP at a concentration of 0.5 g/dL at 25° C.

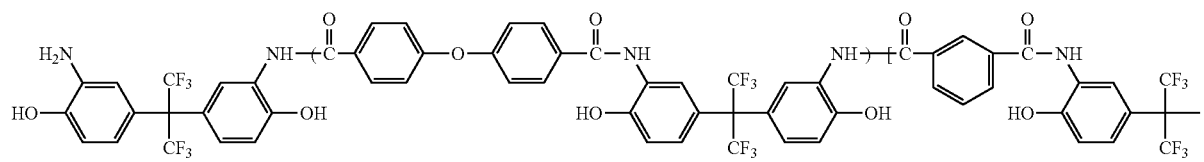

(Ib)

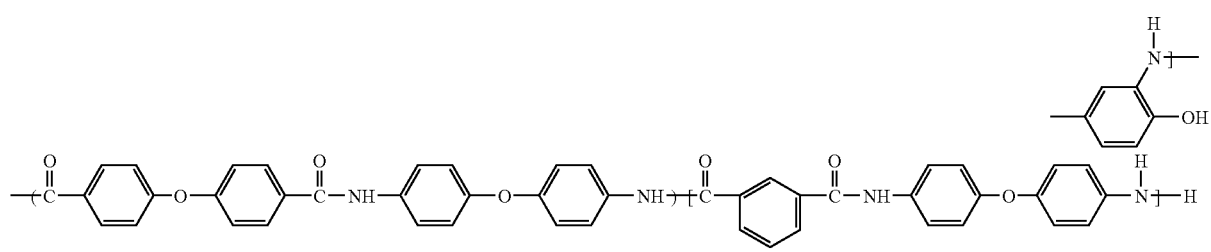

SYNTHESIS EXAMPLE 7

Synthesis of Polybenzoxazole Precursor Polymer of Structure (IIc)

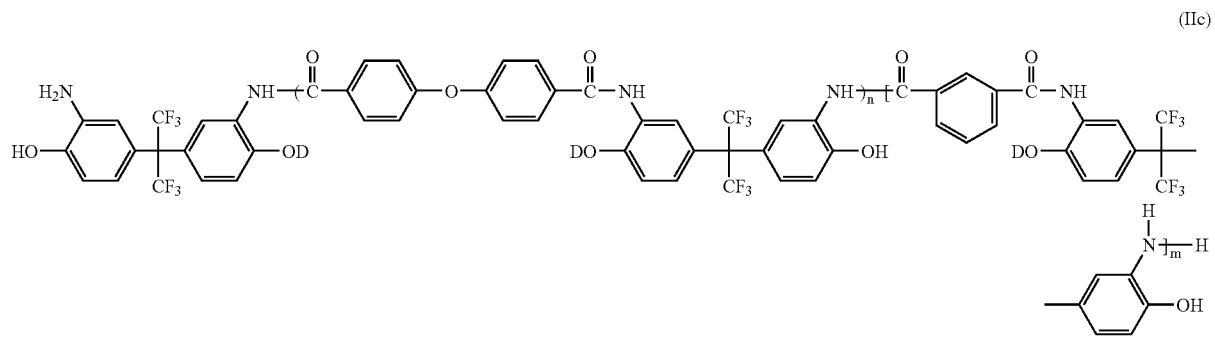

(IIc)

Polymer IIc was synthesized according to the procedure in Synthesis Example 2 except that polymer Ic from Example 6 was employed and the ratio of 5-naphthoquinone diazide sulfonyl chloride to OH group was changed from 1.5% to 1%.

The yield was quantitative and the inherent viscosity (iv) of the polymer was 0.180 dL/g measured in NMP at a concentration of 0.5 g/dL at 25° C.

SYNTHESIS EXAMPLE 8

Synthesis of Polybenzoxazole Precursor Polymer of Structure (IV*c)

A PBO precursor polymer prepared according to the procedure in Synthesis Example 7 (200 g) was dissolved in a mixture of 600 g of diglyme and 300 g of propylene glycol methyl ether acetate (PGMEA). Residual water was removed as an azeotrope with PGMEA and diglyme using a rotary evaporator at 65° C. (10-12 torr). About 550 g of solvents was removed during the azeotropic distillation. The reaction solution was placed under a $N_2$ blanket and equipped with a magnetic stirrer. 7 g of nadic anhydride was added followed by 10 g of Pyridine. The reaction was stirred overnight at 50° C. Then the reaction mixture was diluted with 500 g of tetrahydrofuran (THF) and precipitated into 8 L of a 50:50 methanol:water mixture. The polymer was collected by filtration and vacuum dried at 40° C.

The yield was almost quantitative and the inherent viscosity (iv) of the polymer was 0.181 dL/g measured in NMP at a concentration of 0.5 g/dL at 25° C.

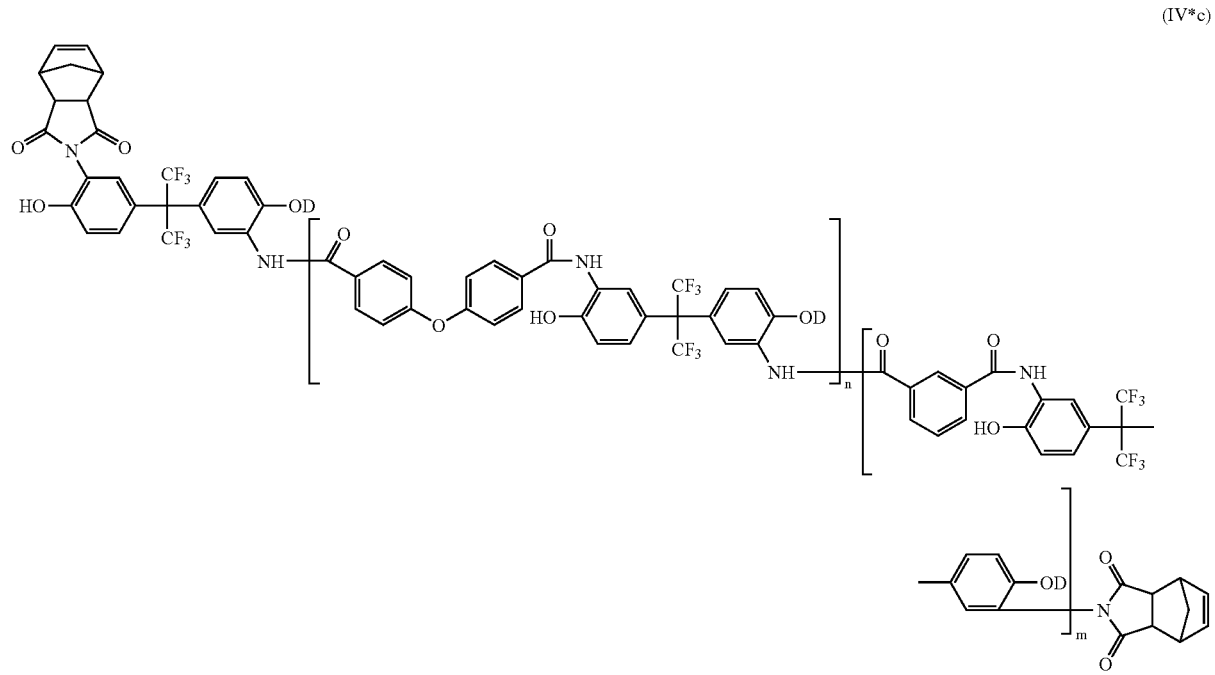

(IV*c)

SYNTHESIS EXAMPLE 9

Preparation of Polybenzoxazole Precursor Polymer of Structure (Id)

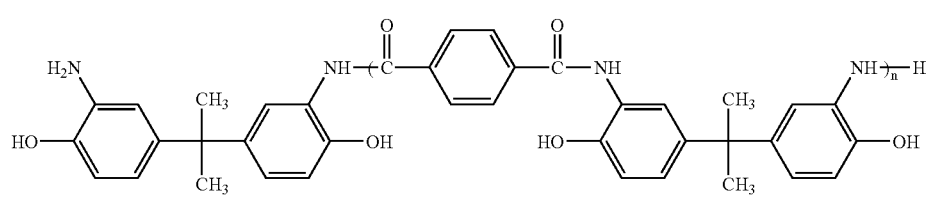

Id

To a 2 L, three-necked, round bottom flask equipped with a mechanical stirrer, nitrogen inlet and addition funnel, 110.0 g (426.0 mmol) of 2,2-bis(3-amino-4-hydroxyphenyl)propane, 64.3 g (794.9 mmol) of pyridine, and 637.5 g of N-methylpyrrolidone (NMP) are added. The solution is stirred at room temperature until all solids dissolve, then cooled in an ice water bath at 0-5° C. To this solution, 78.6 g (388 mmol) of Terephthaloyl chloride in 427.5 g of NMP are added drop-wise. After the addition is completed, the resulting mixture is stirred at room temperature for 18 hours. The viscous solution is precipitated in 10 liters of vigorously stirred de-ionized water. The polymer is collected by filtration and washed with de-ionized water and a water/methanol (50/50) mixture. The polymer is dried under vacuum conditions at 105° C. for 24 hours.

The yield is quantitative and the inherent viscosity (iv) of the polymer is 0.21 dL/g measured in NMP at a concentration of 0.5 g/dL at 25° C.

(213.0 mmol) of 2,2-bis(3-amino-4-hydroxyphenyl)propane, 77.95 g (213 mmol) hexafluoro-2,2-bis(3-amino-4-hydroxyphenyl)propane, 64.3 g (794.9 mmol) of pyridine, and 637.5 g of N-methylpyrrolidone (NMP) are added. The solution is stirred at room temperature until all solids dissolve, then cooled in an ice water bath at 0-5° C. To this solution, 78.6 g (388 mmol) of terephthaloyl chloride in 427.5 g of NMP are added drop-wise. After the addition is completed, the resulting mixture is stirred at room temperature for 18 hours. The viscous solution is precipitated in 10 liters of vigorously stirred de-ionized water. The polymer is collected by filtration and washed with de-ionized water and a water/methanol (50/50) mixture. The polymer is dried under vacuum conditions at 105° C. for 24 hours.

The yield is quantitative and the inherent viscosity (iv) of the polymer is 0.205 dL/g measured in NMP at a concentration of 0.5 g/dL at 25° C.

SYNTHESIS EXAMPLE 10

Preparation of Polybenzoxazole Precursor Polymer of Structure (Ie)

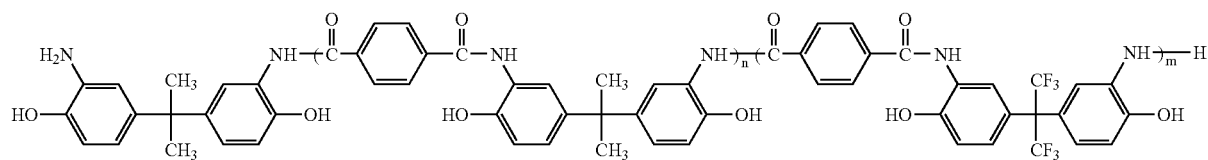

Ie

To a 2 L, three-necked, round bottom flask equipped with a mechanical stirrer, nitrogen inlet and addition funnel, 55.0 g

SYNTHESIS EXAMPLE 11

Preparation of Polybenzoxazole Precursor Polymer of Structure (If)

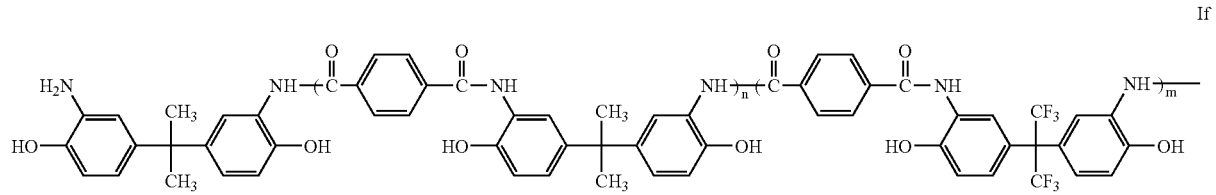

If

-continued

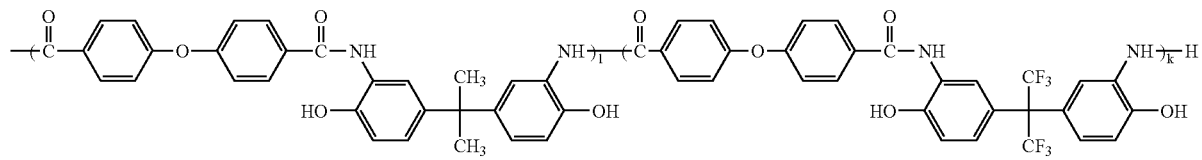

To a 2 L, three-necked, round bottom flask equipped with a mechanical stirrer, nitrogen inlet and addition funnel, 55.0 g (213.0 mmol) of 2,2-bis(3-amino-4-hydroxyphenyl)propane, 77.95 g (213 mmol) hexafluoro-2,2-bis(3-amino-4-hydroxyphenyl)propane, 64.3 g (794.9 mmol) of pyridine, and 637.5 g of N-methylpyrrolidone (NMP) are added. The solution is stirred at room temperature until all solids dissolve, then cooled in an ice water bath at 0-5° C. To this solution, 39.3 g (194 mmol) of terephthaloyl chloride, and 56.9 g (194 mmol) of 1,4-oxydibenzoyl chloride dissolved in 427.5 g of NMP, are added drop-wise. After the addition is completed, the resulting mixture is stirred at room temperature for 18 hours. The viscous solution is precipitated in 10 liters of vigorously stirred de-ionized water. The polymer is collected by filtration and washed with de-ionized water and a water/methanol (50/50) mixture. The polymer is dried under vacuum conditions at 105° C. for 24 hours.

The yield is quantitative and the inherent viscosity (iv) of the polymer is 0.20 dL/g measured in NMP at a concentration of 0.5 g/dL at 25° C.

SYNTHESIS EXAMPLE 12

Preparation of Polybenzoxazole Precursor Polymer of Structure (IIIa)

100 g of the PBO precursor polymer obtained following the procedure from Synthesis Example 1 was dissolved in 1000 g of Diglyme. Residual water was removed as an azeotrope with Diglyme using a rotary evaporator at 65° C. (10-12 torr). About 500 g of solvents was removed during the azeotropic distillation. The reaction solution was placed under a $N_2$ blanket, equipped with a magnetic stirrer and cooled using an ice bath down to ~5° C. 3.6 g Acetyl chloride was added via syringe. The reaction was held on the ice bath for about 10 min. Then the ice bath was removed and the reaction was allowed to warm up over the period of 1 hr. Then, the mixture was again cooled to 5° C. on the ice bath. 3.6 g Pyridine was added via syringe over the period of 1 hr. The reaction was kept on the ice bath for ~10 min following the pyridine addition, and then was allowed to warm up over the period of 1 hr. The reaction mixture was precipitated into 6 L of water with stirring. The precipitated polymer was collected by filtration and air dried overnight. Then, the polymer was dissolved in 500-600 g of acetone and precipitated into 6 L of water/methanol (70/30). The polymer was again collected by filtration and air-dried for several hours. The still damp polymer cake was dissolved in a mixture of 700 g of THF and 70 ml of water. An ion exchange resin UP604 (40 g), available from Rohm and Haas, was added and the solution was rolled for 1

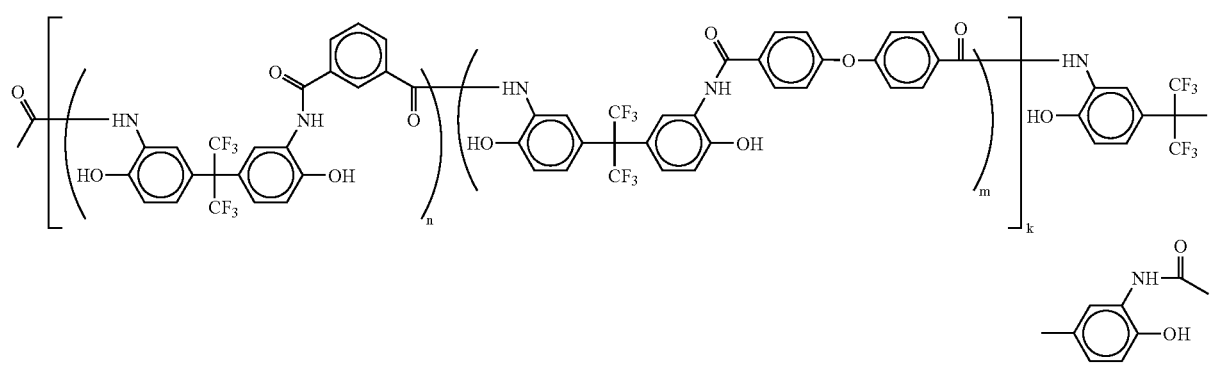

hr. The final product was precipitated in 7 L of water, filtered, air-dried overnight followed by 24 hr drying in vacuum oven at 90° C.

The yield was 100% and the inherent viscosity (iv) of the polymer was 0.205 dL/g measured in NMP at a concentration of 0.5 g/dL at 25° C.

SYNTHESIS EXAMPLE 13

Synthesis of Polymer IVa

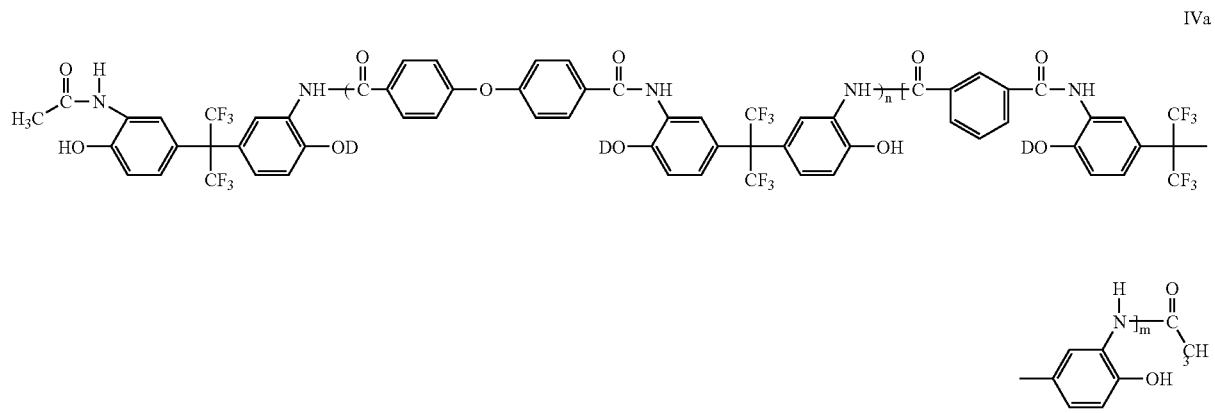

Polymer IVa is synthesized according to the procedure in Synthesis Example 12 except that polymer IIa from Synthesis Example 2 is employed.

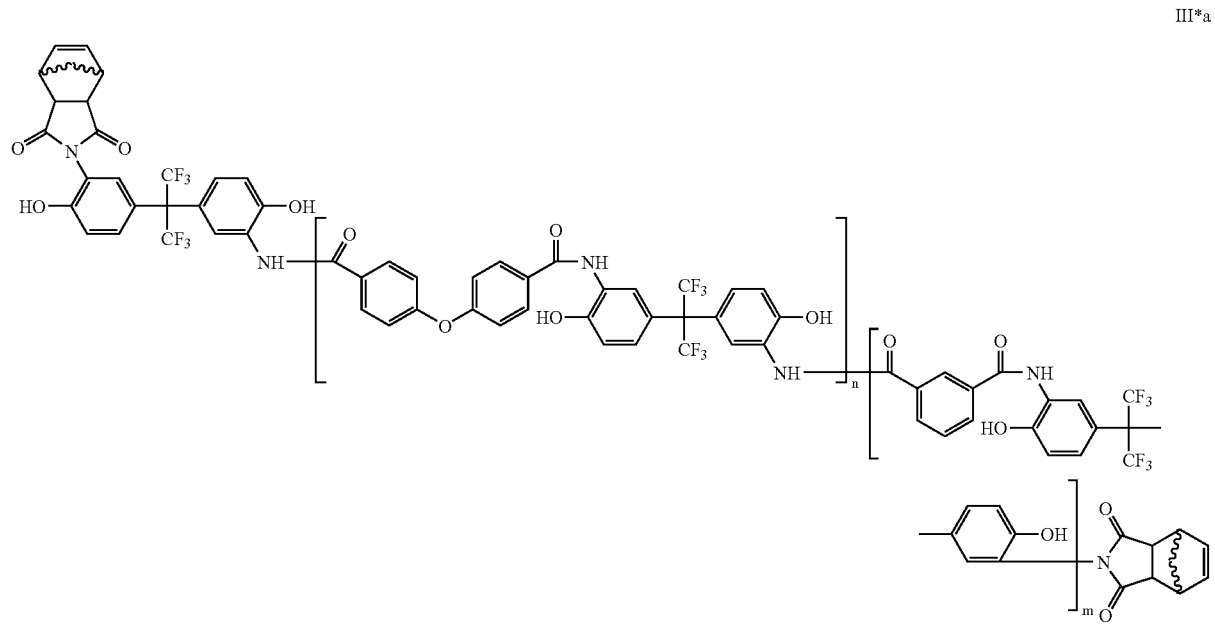

The yield is almost quantitative and the inherent viscosity (iv) of the polymer is 0.20 dL/g measured in NMP at a concentration of 0.5 g/dL at 25° C.

SYNTHESIS EXAMPLE 14

Preparation of a PBO Precursor Polymer III*a End Capped with an Imide Endcap

A PBO precursor polymer prepared in the same way as in Synthesis Example 1 (200 g) was dissolved in a mixture of 600 g of Diglyme and 300 g of propylene glycol methyl ether acetate (PGMEA). Residual water was removed as an azeotrope with PGMEA and Diglyme using a rotary evaporator at 65° C. (10-12 torr). About 550 g of solvents was removed during the azeotropic distillation. The reaction solution was placed under a N2 blanket and equipped with a magnetic stirrer. Nadic anhydride (7 g) was added followed by 10 g of Pyridine. The reaction was stirred overnight at 50° C. Then the reaction mixture was diluted with 500 g of tetrahydrofuran (THF) and precipitated into 8 L of a 50:50 methanol:water mixture. The polymer was collected by filtration and vacuum dried at 80° C.

The yield was almost quantitive and the inherent viscosity (iv) of the polymer was 0.20 dL/g measured in NMP at a concentration of 0.5 g/dL at 25° C.

SYNTHESIS EXAMPLE 15

Preparation of 4,4'-Oxydiphthalic Anhydride (ODPA)/Oxydianiline (ODA) Polyamic Acid inlet. 270 g of gamma-butyrolactone was added to this reaction flask followed by addition of 31.022 g (100 mmol) of 4,4'-oxydiphthalic anhydride (ODPA). The ODPA charging funnel was rinsed with 15 g of gamma-butyrolactone. The reaction mixture was stirred at room temperature for 15 minutes and then at 73-75° C. until 4,4'-oxydiphthalic anhydride was fully dissolved. The clear, pale yellow reaction solution was cooled to 15° C. The 4,4'-oxydiphthalic anhydride was partially precipitated. 19.62 g (98 mmol) of oxydianiline was added portion wise over the period of an hour. The oxydianiline container was rinsed with 13.3 g gamma-butyrolactone, which was then added to the reaction solution in one portion. The reaction temperature was kept at 15° C. for another 15 minutes and then slowly increased to 40° C. The reaction mixture was allowed to stir at this temperature for 24 hours. The reaction was complete as evidenced by the absence of an anhydride peak (1800 cm$^{-1}$) from the IR spectrum of the solution. The viscosity of the final product was 1384 cSt.

SYNTHESIS EXAMPLE 16

Preparation of Polybenzoxazole Precursor Polymer of Structure III*d

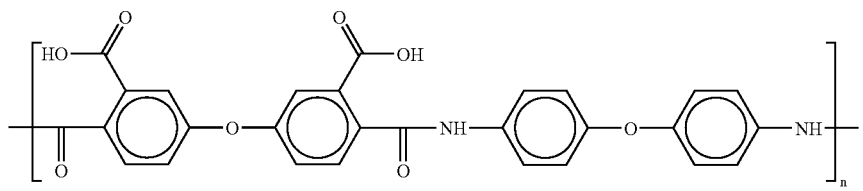

A 500 mL, three neck, round bottom flask was equipped with a mechanical stirrer, temperature controller and nitrogen

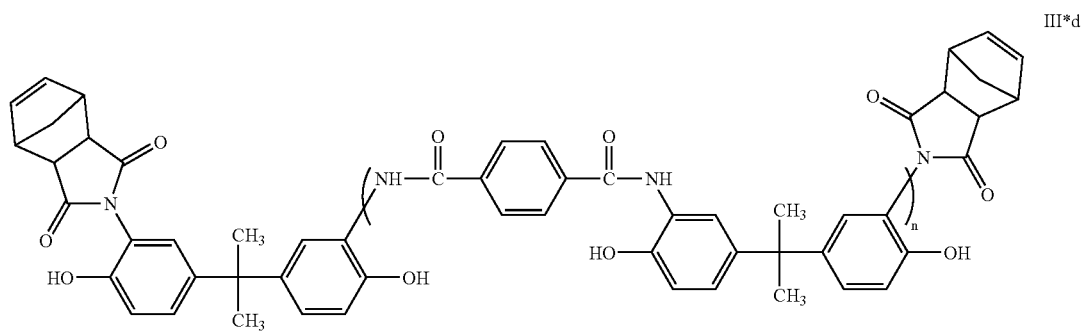

III*d

Synthesis Example 14 is repeated except the polymer prepared in Synthesis Example 9 is used instead of polymer prepared in Synthesis Example 1.

The yield is almost quantitative and the inherent viscosity (iv) of the polymer is 0.20 dL/g measured in NMP at a concentration of 0.5 g/dL at 25° C.

SYNTHESIS EXAMPLE 17

Preparation of a PBO Precursor Polymer End Capped with a p-Toluene Sulfonic Group

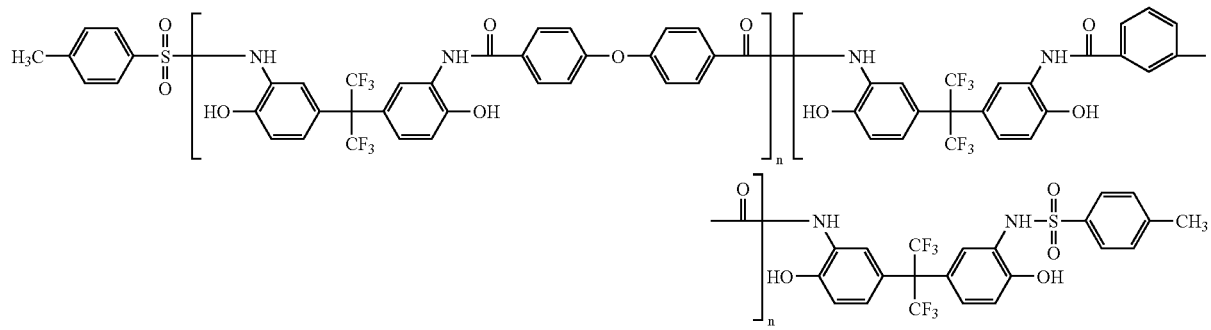

The PBO precursor polymer was prepared as described in Synthesis Example 1. 100 g or the PBO precursor was dissolved in a mixture of 500 g of diglyme and 300 g of propylene glycol methyl ether acetate (PGMEA). Residual water was removed as an azeotrope with PGMEA and diglyme using vacuum distillation at 65° C. (10-12 torr). About 400 g of solvents was removed during the azeotropic distillation. The reaction solution was placed under a $N_2$ blanket and then cooled in an ice bath down to 5° C. and 3.2 g of pyridine was added at once followed by 8.5 g of p-toluene sulfonic acid chloride. The reaction mixture was warmed up to room temperature and stirred overnight.

The reaction mixture was precipitated into 6 L of water with stirring. The precipitated polymer was collected by filtration and air dried overnight. Then, the polymer was dissolved in 500-600 g of acetone and precipitated into a 6 L water/methanol (70/30) mixture. The polymer was again collected by filtration and air-dried for several hours. The still damp polymer cake was dissolved in a mixture of 700 g of THF and 70 ml of water. An ion exchange resin UP604 (40 g), available from Rohm and Haas, was added and the solution was rolled for 1 hr. The final product was precipitated in 7 L of water, filtered, air-dried overnight followed by 24 hr. drying in a vacuum oven at 90° C.

$^1$H NMR analysis showed the absence of any amine peaks at ~4.5 ppm as well as the absence of aromatic peaks due to uncapped BisAPAf units at 6.4-6.7 ppm. This indicates that end capping was complete. The yield was 77 g.

EXAMPLE 30

100 parts of the polymer obtained in Synthesis Example 5, 3 parts of N-(3-triethoxysilylpropyl)maleic monoamide, 1 part of 2-mercaptobenzoxazole, 2.5 parts of diphenylsilanediol, 20 parts of PAC synthesized in Example 3 were dissolved in 175 parts GBL and filtered. The formulation was spin coated on a copper wafer then baked on a hotplate for 4 minutes at 120° C., resulting in a film thickness of 11.1 µm. The film was then exposed utilizing an i-line stepper in a patterned exposure array, which incrementally increased exposure energy 30 mJ/cm$^2$ with a starting exposure energy of 300 mJ/cm$^2$. The exposed film was then developed using two 30 second puddles with a 2.38% TMAH solution of water. The patterned copper wafers were then scratched with a pair of tweezers so as to peel off any material down to the copper substrate. The scratch was then analyzed under a microscope concentrating on areas were the scratch dissected exposed patterns. This scratching technique allowed differentiation between the substrate (bare copper) and any residue remaining in the exposed area. No residue was observed.

EXAMPLE 31

100 parts of the polymer obtained in Synthesis Example 8, 3 parts of gamma-mercaptopropyltrimethoxy silane, 1 part of 2-mercaptobenzoxazole and 12 parts of PAC XIII r, wherein Q is H or

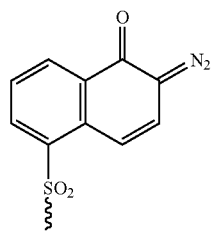

were dissolved in 175 parts GBL and filtered. The PAC used had an esterification level of 75% of the hydroxyl groups with the DNQ moiety shown above.

The formulation was spin coated on a copper wafer then baked on a hotplate for 4 minutes at 120° C., resulting in a film thickness of 10.92 µm. The film was then exposed utilizing an i-line stepper in a patterned exposure array, which incrementally increased exposure energy 30 mJ/cm$^2$ with a starting exposure energy of 300 mJ/cm$^2$. The exposed film was then developed using two 30 second puddles with a 2.38% TMAH solution of water. The patterned copper wafers were then scratched with a pair of tweezers so as to peel off any material down to the copper substrate. The scratch was then analyzed under a microscope concentrating on areas were the scratch dissected exposed patterns. This scratching technique allowed differentiation between the substrate (bare copper) and any residue remaining in the exposed area. No residue was observed.

EXAMPLE 32

100 parts of the polymer obtained in Synthesis Example 9, 3 parts of gamma-mercaptopropyltrimethoxy silane, 0.5 parts of 2-mercapto-5-methylbenzimidazole, 0.5 parts of 2 mercaptobenzoxazole and 20 parts of PAC XIII o, wherein Q is H or

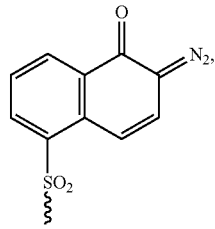

are dissolved in 175 parts GBL and filtered. The PAC used has an esterification level of 80% of the hydroxyl groups with the DNQ moiety shown above.

The formulation is spin coated on a copper wafer then baked on a hotplate for 4 minutes at 120° C., resulting in a film thickness of 11 µm. The film is then exposed utilizing an i-line stepper in a patterned exposure array, which incrementally increased exposure energy 30 mJ/cm$^2$ with a starting exposure energy of 300 mJ/cm$^2$. The exposed film is then developed using two 30 second puddles with a 2.38% TMAH solution of water. The patterned copper wafer is then scratched with a pair of tweezers so as to peel off any material down to the copper substrate. The scratch is then analyzed under a microscope concentrating on areas were the scratch dissected exposed patterns. This scratching technique allows differentiation between the substrate (bare copper) and any residue remaining in the exposed area. No residue is observed.

EXAMPLE 33

100 parts of the polymer obtained in Synthesis Example 10, 3 parts of gamma-mercaptopropyltrimethoxy silane, 1 part of 2-mercapto-5-methylbenzimidazole and 20 parts of PAC XIII e, wherein Q is H or

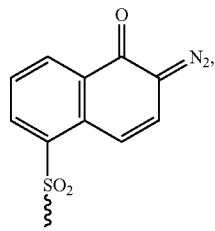

are dissolved in 175 parts GBL and filtered. The PAC used has an esterification level of 50% of the hydroxyl groups with the DNQ moiety shown above.

The formulation is spin coated on a copper wafer then baked on a hotplate for 4 minutes at 120° C., resulting in a film thickness of 11 µm. The film is then exposed utilizing an i-line stepper in a patterned exposure array, which incrementally increased exposure energy 30 mJ/cm$^2$ with a starting exposure energy of 300 mJ/cm$^2$. The exposed film is then developed using two 30 second puddles with a 2.38% TMAH solution of water. The patterned copper wafer is then scratched with a pair of tweezers so as to peel off any material down to the copper substrate. The scratch is then analyzed under a microscope concentrating on areas where the scratch dissected exposed patterns. This scratching technique allows differentiation between the substrate (bare copper) and any residue remaining in the exposed area. No residue is observed.

EXAMPLE 34

100 parts of the polymer obtained in Synthesis Example 11, 3 parts of gamma-mercaptopropyltrimethoxy silane, 1 part of 2-mercaptobenzoxazole and 20 parts of PAC XIII f, wherein Q is H or

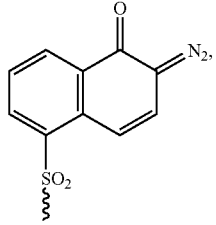

are dissolved in a mixture of 135 parts GBL and 40 parts PGMEA, and filtered. The PAC used has an esterification level of 75% of the hydroxyl groups with the DNQ moiety shown above.

The formulation is spin coated on a copper wafer then baked on a hotplate for 4 minutes at 120° C., resulting in a film thickness of 11 µm. The film is then exposed utilizing an i-line stepper in a patterned exposure array, which incrementally increased exposure energy 30 mJ/cm$^2$ with a starting exposure energy of 300 mJ/cm$^2$. The exposed film is then developed using two 30 second puddles with a 2.38% TMAH solution of water. The patterned copper wafer is then scratched with a pair of tweezers so as to peel off any material down to the copper substrate. The scratch is then analyzed under a microscope concentrating on areas were the scratch dissected exposed patterns. This scratching technique allows differentiation between the substrate (bare copper) and any residue remaining in the exposed area. No residue is observed.

EXAMPLE 35

50 parts of the polymer obtained in Synthesis Example 7, 50 parts of the polymer obtained in Synthesis Example 8, 3 parts of N-(3-triethoxysilylpropyl)maleic monoamide, 0.5 parts of 2-mercaptobenzoxazole, 0.5 parts of 2-mercapto-5-methylbenzimidazole, 2.5 parts of diphenylsilanediol, 12 parts of PAC synthesized in Example 4 are dissolved in 175 parts GBL and filtered. The formulation is spin coated on a copper wafer then baked on a hotplate for 4 minutes at 120° C., resulting in a film thickness of 11 µm. The film is then exposed utilizing an i-line stepper in a patterned exposure array, which incrementally increased exposure energy 30 mJ/cm$^2$ with a starting exposure energy of 300 mJ/cm$^2$. The exposed film is then developed using two 30 second puddles with a 2.38% TMAH solution of water. The patterned copper wafer is then scratched with a pair of tweezers so as to peel off any material down to the copper substrate. The scratch is then analyzed under a microscope concentrating on areas were the scratch dissected exposed patterns. This scratching technique allows differentiation between the substrate (bare copper) and any residue remaining in the exposed area. No residue is observed.

EXAMPLE 37

50 parts of the polymer obtained in Synthesis Example 1, 50 parts of the polymer obtained in Synthesis Example 2, 3 parts of N-(3-triethoxysilylpropyl)maleic monoamide, 1 parts of 2-mercapto-5-methylbenzimidazole, 2.5 parts of diphenylsilanediol, 16 parts of PAC synthesized in Example 4 are dissolved in a mixture of 160 parts GBL and 10 parts ethyl lactate, and filtered. The formulation is spin coated on a copper wafer then baked on a hotplate for 4 minutes at 120° C., resulting in a film thickness of 11 μm. The film is then exposed utilizing an i-line stepper in a patterned exposure array, which incrementally increased exposure energy 30 mJ/cm$^2$ with a starting exposure energy of 300 mJ/cm$^2$. The exposed film is then developed using two 30 second puddles with a 2.38% TMAH solution of water. The patterned copper wafer is then scratched with a pair of tweezers so as to peel off any material down to the copper substrate. The scratch is then analyzed under a microscope concentrating on areas were the scratch dissected exposed patterns. This scratching technique allows differentiation between the substrate (bare copper) and any residue remaining in the exposed area. No residue is observed.

EXAMPLE 38

50 parts of the polymer obtained in Synthesis Example 2, 50 parts of the polymer obtained in Synthesis Example 7, 3 parts of N-(3-triethoxysilylpropyl)maleic monoamide, 1 parts of 2-mercapto-5-methylbenzimidazole, 2.5 parts of diphenylsilanediol, 12 parts of PAC synthesized in Example 4 are dissolved in a mixture of 175 parts GBL and filtered. The formulation is spin coated on a copper wafer then baked on a hotplate for 2 minutes at 130° C., resulting in a film thickness of 11 μm. The film is then exposed utilizing an i-line stepper in a patterned exposure array, which incrementally increased exposure energy 30 mJ/cm$^2$ with a starting exposure energy of 300 mJ/cm$^2$. The exposed film is then developed using two 30 second puddles with a 2.38% TMAH solution of water. The patterned copper wafer is then scratched with a pair of tweezers so as to peel off any material down to the copper substrate. The scratch is then analyzed under a microscope concentrating on areas were the scratch dissected exposed patterns. This scratching technique allows differentiation between the substrate (bare copper) and any residue remaining in the exposed area. No residue is observed.

EXAMPLE 39

100 parts of the polymer obtained in Synthesis Example 12, 3 parts of gamma-ureidopropyltrimethoxysilane, 5 parts of diphenylsilanediol, 11.9 parts of PAC synthesized in Example 4 and 0.5 parts of 2-mercaptobenzoxazole are dissolved in 175 parts GBL and filtered. The formulation is spin coated on a copper wafer and baked on a hotplate for 5 minutes at 90° C., resulting in a film thickness of 11 μm. The film is then exposed utilizing an i-line stepper in a patterned exposure array, which incrementally increased exposure energy 30 mJ/cm$^2$ with a starting exposure energy of 300 mJ/cm$^2$. The exposed film is then developed using two 30 second puddles with a 2.38% TMAH solution of water. The patterned copper wafer is then scratched with a pair of tweezers so as to peel off any material down to the copper substrate. The scratch is then analyzed under a microscope concentrating on areas were the scratch dissected exposed patterns. No residue is observed.

EXAMPLE 40

100 parts of the polymer obtained in Synthesis Example 13, 3 parts of gamma-ureidopropyltrimethoxysilane, 5 parts of diphenylsilanediol, 11.9 parts of PAC synthesized in Example 4 and 0.5 parts of 2-mercaptobenzoxazole are dissolved in 175 parts GBL and filtered. The formulation is spin coated on a copper wafer and baked on a hotplate for 4 minutes at 120° C., resulting in a film thickness of 11 μm. The film is then exposed utilizing an i-line stepper in a patterned exposure array, which incrementally increased exposure energy 30 mJ/cm$^2$ with a starting exposure energy of 300 mJ/cm$^2$. The exposed film is then developed using two 30 second puddles with a 2.38% TMAH solution of water. The patterned copper wafer is then scratched with a pair of tweezers so as to peel off any material down to the copper substrate. The scratch is then analyzed under a microscope concentrating on areas were the scratch dissected exposed patterns. No residue is observed.

EXAMPLE 41

100 parts of the polymer obtained in Synthesis Example 2, 1.53 parts of gamma-ureidopropyltrimethoxysilane, 2.48 parts of diphenylsilanediol, 13.51 parts of PAC synthesized in Example 3 and 1 part of 2-mercaptobenzoxazole are dissolved in 175 parts GBL and filtered. The formulation is spin coated on a copper wafer then baked on a hotplate for 4 minutes at 120° C., resulting in a film thickness of 11 μm. The film is then exposed utilizing an i-line stepper in a patterned exposure array, which incrementally increased exposure energy 30 mJ/cm$^2$ with a starting exposure energy of 300 mJ/cm$^2$. The exposed film is then developed using two 30 second puddles with a 2.38% TMAH solution of water. The patterned copper wafer is then scratched with a pair of tweezers so as to peel off any material down to the copper substrate. The scratch is then analyzed under a microscope concentrating on areas were the scratch dissected exposed patterns. This scratching technique allows differentiation between the substrate (bare copper) and any residue remaining in the exposed area. No residue is observed.

EXAMPLE 42

A photosensitive formulation is prepared by mixing together 100 parts by weight of a PBO precursor polymer, prepared in the same way as in Synthesis Example 12, 200 parts of GBL, 5 parts of (5-propylsulfonyloxyimino-5H-thiophen-2-ylidene)-2-methylphenyl-acetonitrile, 31.25 parts of ODPA/ODA polymer prepared in Synthesis Example 15, 3 parts of 2-mercapto-5-methylbenzimidazole and 10 parts of Powderlink 1174. This composition is then spin coated onto a copper wafer and baked on a hotplate for 3 minutes at 120° C. to obtain a film of about 12 μm in thickness. This film is exposed portion wise using incremental exposures on a Cannon 3000i4 exposure tool starting at 50 mJ/cm$^2$ incrementing the exposure dose by 50 mJ/cm$^2$. The coated, exposed wafer is then baked at 120° C. for 3 min, developed for 95 seconds under a continuous spray of 0.262N aqueous TMAH solution, and rinsed with de-ionized water to provide a relief pattern. The patterned copper wafer is then scratched with a pair of tweezers so as to peel off any material down to the copper substrate. The scratch is then analyzed under a microscope concentrating on areas where the scratch dissected unexposed patterns. This scratching technique allows differentiation between the substrate (bare copper) and any residue remaining in the exposed area. No residue is observed.

EXAMPLE 43

A photosensitive formulation is prepared by mixing together 100 parts by weight of a PBO precursor polymer, prepared in the same way as in Synthesis Example 14, 180 parts of GBL, 20 parts of PGMEA, 5 parts of (5-propylsulfonyloxyimino-5H-thiophen-2-ylidene)-2-methylphenyl-acetonitrile, 1.4 parts of 2-mercapto-1-methylimidazole, 3 parts of beta-(3,4-epoxycyclohexyl)ethyltrimethoxysilane and 10 parts of Cymel 303. This composition is then spin coated onto a copper wafer and baked on a hotplate for 3 minutes at 120° C. to obtain a film of about 12 µm in thickness. This film is exposed portion wise using incremental exposures on a Cannon 3000i4 exposure tool starting at 50 mJ/cm² incrementing the exposure dose by 50 mJ/cm². The coated, exposed wafer is then baked at 120° C. for 3 min, developed for 95 seconds under a continuous spray of 0.262N aqueous TMAH solution, and rinsed with de-ionized water to provide a relief pattern. The patterned copper wafer is then scratched with a pair of tweezers so as to peel off any material down to the copper substrate. The scratch is then analyzed under a microscope concentrating on areas where the scratch dissected unexposed patterns. This scratching technique allows differentiation between the substrate (bare copper) and any residue remaining in the exposed area. No residue is observed.

EXAMPLE 44

A photosensitive formulation is prepared by mixing together 50 parts by weight of a PBO precursor polymer, prepared in the same way as in Synthesis Example 9, 50 parts by weight of a PBO precursor polymer, prepared in the same way as in Synthesis Example 16, 180 parts of GBL, 20 parts of PGMEA, 5 parts of (5-propylsulfonyloxyimino-5H-thiophen-2-ylidene)-2-methylphenyl-acetonitrile, 22.5 parts of ODPA/ODA polymer prepared in Synthesis Example 15, 3 parts of gamma-ureidopropyltrimethoxysilane, 2 parts of 2-mercapto-1-methylimidazole, and 10 parts of Powderlink 1174. This composition is then spin coated onto a copper wafer and baked on a hotplate for 4 minutes at 115° C. to obtain a film of about 11.5 µm in thickness. This film is exposed portion wise using incremental exposures on a Cannon 3000i4 exposure tool starting at 50 mJ/cm² incrementing the exposure dose by 25 mJ/cm². The coated, exposed wafer is then baked at 125° C. for 150 seconds, developed for 80 seconds under a continuous spray of 0.262N aqueous TMAH solution, and rinsed with de-ionized water to provide a relief pattern. The patterned copper wafer is then scratched with a pair of tweezers so as to peel off any material down to the copper substrate. The scratch is then analyzed under a microscope concentrating on areas where the scratch dissected unexposed patterns. This scratching technique allows differentiation between the substrate (bare copper) and any residue remaining in the exposed area. No residue is observed.

EXAMPLE 45

A photosensitive formulation is prepared by mixing together 50 parts by weight of a PBO precursor polymer, prepared in the same way as in Synthesis Example 14, 50 parts by weight of a PBO precursor polymer, prepared in the same way as in Synthesis Example 16, 175 parts of GBL, 25 parts of dipropylene glycol dimethyl ether, 7.5 parts of PAG A (structure shown below), 27.5 parts of ODPA/ODA polymer prepared in Synthesis Example 3, 4 parts of N-3-triethoxysilylpropyl)-4,5-dihydroimimdazole, 2.5 parts of 2-mercapto-5-methylbenzimidazole and 10 parts of Powderlink 1174. This composition is then spin coated onto a copper wafer and baked on a hotplate for 3.5 minutes at 125° C. to obtain a film of about 13 µm in thickness. This film is exposed portion wise using incremental exposures on a Cannon 3000i4 exposure tool starting at 50 mJ/cm² incrementing the exposure dose by 50 mJ/cm². The coated, exposed wafer is then baked at 130° C. for 175 seconds, developed for 100 seconds under a continuous spray of 0.262N aqueous TMAH solution, and rinsed with de-ionized water to provide a relief pattern. The patterned copper wafer is then scratched with a pair of tweezers so as to peel off any material down to the copper substrate. The scratch is then analyzed under a microscope concentrating on areas where the scratch dissected unexposed patterns. This scratching technique allows differentiation between the substrate (bare copper) and any residue remaining in the exposed area. No residue is observed.

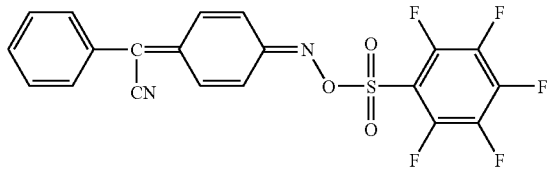

PAG A

EXAMPLE 46

A photosensitive formulation is prepared by mixing together 100 parts by weight of a PBO precursor polymer, prepared in the same way as in Synthesis Example 16, 170 parts of GBL, 30 parts of diglyme, 7.5 parts of PAG B (structure shown below), 2 parts of n-butylaminopropyltrimethoxysilane, 0.5 parts of 2-mercapto-5-methylbenzimidazole, 0.75 parts of 2-mercapto-1-methylimidazole and 15 parts of Cymel 303. This composition is then spin coated onto a copper wafer and baked on a hotplate for 4.5 minutes at 120° C. to obtain a film of about 12.5 µm in thickness. This film is exposed portion wise using incremental exposures on a Cannon 3000i4 exposure tool starting at 50 mJ/cm² incrementing the exposure dose by 50 mJ/cm². The coated, exposed wafer is then baked at 125° C. for 175 seconds, developed for 100 seconds under a continuous spray of 0.262N aqueous TMAH solution, and rinsed with de-ionized water to provide a relief pattern. The patterned copper wafer is then scratched with a pair of tweezers so as to peel off any material down to the copper substrate. The scratch is then analyzed under a microscope concentrating on areas where the scratch dissected unexposed patterns. This scratching technique allows differentiation between the substrate (bare copper) and any residue remaining in the exposed area. No residue is observed.

PAG B

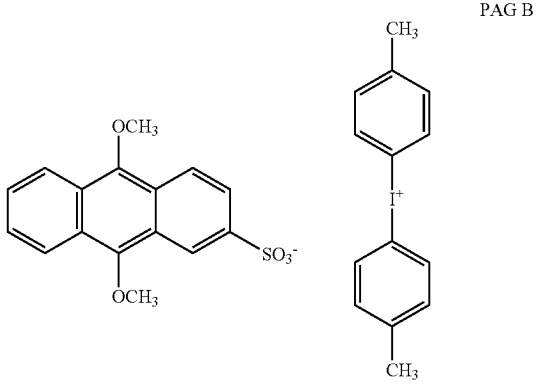

EXAMPLE 47

A photosensitive formulation is prepared by mixing together 50 parts by weight of a PBO precursor polymer, prepared in the same way as in Synthesis Example 4, 50 parts by weight of a PBO precursor polymer, prepared in the same way as in Synthesis Example 6, 165 parts of GBL, 35 parts of diacetone alcohol, 10 parts of PAG C (structure shown below), 35 parts of ODPA/ODA polymer prepared in Synthesis Example 3, 2 parts of (cyclohexylaminomethyl)triethoxysilane, 0.75 parts of 2-mercapto-5-methylbenzimidazole, 0.75 parts of 2-mercapto-1-methylimidazole and 7.5 parts of Powderlink 1174. This composition is then spin coated onto a copper wafer and baked on a hotplate for 4 minutes at 130° C. to obtain a film of about 10 µm in thickness. This film is exposed portion wise using incremental exposures on a Cannon 3000i4 exposure tool starting at 50 mJ/cm² incrementing the exposure dose by 50 mJ/cm². The coated, exposed wafer is then baked at 130° C. for 175 seconds, developed for 100 seconds under a continuous spray of 0.262N aqueous TMAH solution, and rinsed with de-ionized water to provide a relief pattern. The patterned copper wafer is then scratched with a pair of tweezers so as to peel off any material down to the copper substrate. The scratch is then analyzed under a microscope concentrating on areas where the scratch dissected unexposed patterns. This scratching technique allows differentiation between the substrate (bare copper) and any residue remaining in the exposed area. No residue is observed.

PAG C

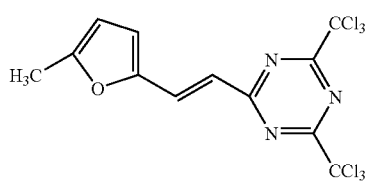

EXAMPLE 48

100 parts of the polymer obtained in Synthesis Example 17, 1.53 parts of gamma-ureidopropyltrimethoxysilane, 2.48 parts of diphenylsilanediol, 13.51 parts of PAC synthesized in Example 3 and 1 part of 2-mercaptobenzoxazole are dissolved in 175 parts GBL and filtered. The formulation is spin coated on a copper wafer then baked on a hotplate for 4 minutes at 120° C., resulting in a film thickness of 11 µm. The film is then exposed utilizing an i-line stepper in a patterned exposure array, which incrementally increased exposure energy 30 mJ/cm² with a starting exposure energy of 300 mJ/cm². The exposed film is then developed using two 30 second puddles with a 2.38% TMAH solution of water. The patterned copper wafer is then scratched with a pair of tweezers so as to peel off any material down to the copper substrate. The scratch is then analyzed under a microscope concentrating on areas were the scratch dissected exposed patterns. This scratching technique allows differentiation between the substrate (bare copper) and any residue remaining in the exposed area. No residue is observed.

COMPARATIVE EXAMPLE 13

A photosensitive formulation was prepared by mixing together 100 parts by weight of a PBO precursor polymer, prepared in the same way as in Synthesis Example 12, 200 parts of GBL, 5 parts of (5-propylsulfonyloxyimino-5H-thiophen-2-ylidene)-2-methylphenyl-acetonitrile, 31.25 parts of ODPA/ODA polymer prepared in Synthesis Example 15, and 10 parts of Powderlink 1174. This composition was then spin coated onto a copper wafer and baked on a hotplate for 3 minutes at 120° C. to obtain a film of about 12 µm in thickness. This film was exposed portion wise using incremental exposures on a Cannon 3000i4 exposure tool starting at 50 mJ/cm² incrementing the exposure dose by 50 mJ/cm². The coated, exposed wafer was then baked at 120° C. for 3 min, developed for 95 seconds under a continuous spray of 0.262N aqueous TMAH solution, and rinsed with de-ionized water to provide a relief pattern. The patterned copper wafer was then scratched with a pair of tweezers so as to peel off any material down to the copper substrate. The scratch was then analyzed under a microscope concentrating on areas where the scratch dissected unexposed patterns. This scratching technique allowed differentiation between the substrate (bare copper) and any residue remaining in the exposed area. A relatively thick residue was observed.

In the processes of this invention for forming the relief images, the substrate is preferably a substrate that has copper metallization.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:
1. A photosensitive resin composition comprising:
  (a) at least one polybenzoxazole precursor polymer;
  (b) at least one compound having Structure VI

VI

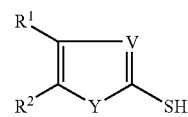

wherein, V is selected from the group consisting of CH and N, Y is selected from the group consisting of O and NR³ wherein R³ is selected from the group consisting of H, CH₃ and C₂H₅, R¹ and R² are each independently selected from the group consisting of H, C₁-C₄ alkyl group, C₁-C₄ alkoxy group, cyclopentyl and cyclohexyl, or $R^1$ and $R^2$ can be fused to produce a substituted or unsubstituted benzene ring; and
(c) at least one solvent;
wherein the amount of the compound of Structure VI present in the composition is an amount effective to inhibit residue from forming when the composition is coated on a substrate and the coated substrate is subsequently processed to form an image on the substrate, and with the proviso that if the polybenzoxazole precursor polymer solely consists of polybenzoxazole precursor polymers that do not contain a photoactive moiety in the polymer, then (d) at least one photoactive compound is also present in the composition.

2. A photosensitive composition according to claim 1 comprising a positive photosensitive resin composition wherein the polybenzoxazole precursor polymer comprises:

at least one polybenzoxazole precursor polymer having Structure I or II or III or III* or IV or IV* or V,

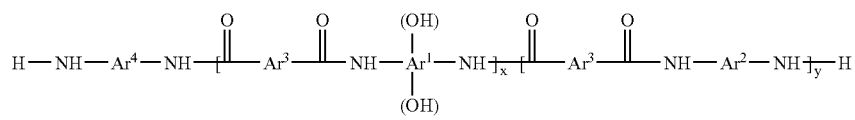

I

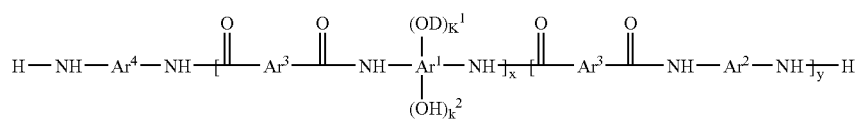

II

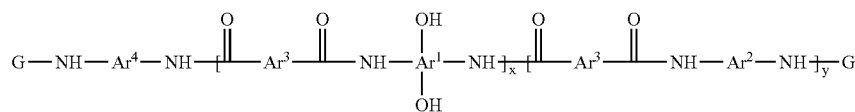

III

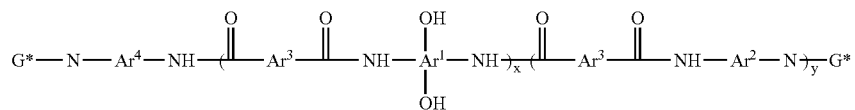

III*

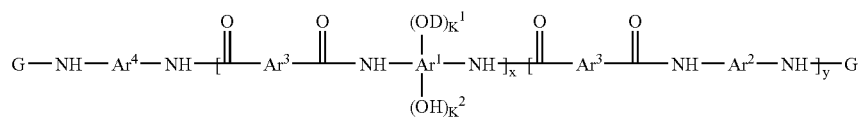

IV

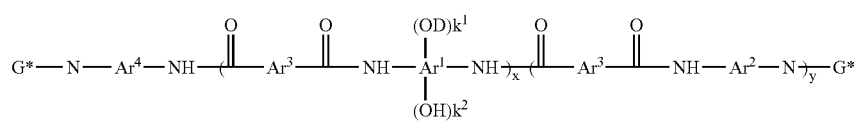

IV*

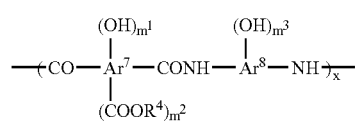

V wherein Ar$^1$ is selected from the group consisting of a tetravalent aromatic group, a tetravalent heterocyclic group, and mixtures thereof; Ar$^2$ is selected from the group consisting of a divalent aromatic, a divalent heterocyclic, a divalent alicyclic, and a divalent aliphatic group that may contain silicon, Ar$^3$ is selected from the group consisting of a divalent aromatic group, a divalent aliphatic group, a divalent heterocyclic group, and mixtures thereof; Ar$^4$ is selected from the group consisting of Ar$^1$(OH)$_2$ and Ar$^2$, x is from about 10 to about 1000; y is from 0 to about 900; D is selected from the group consisting of one of the following moieties:

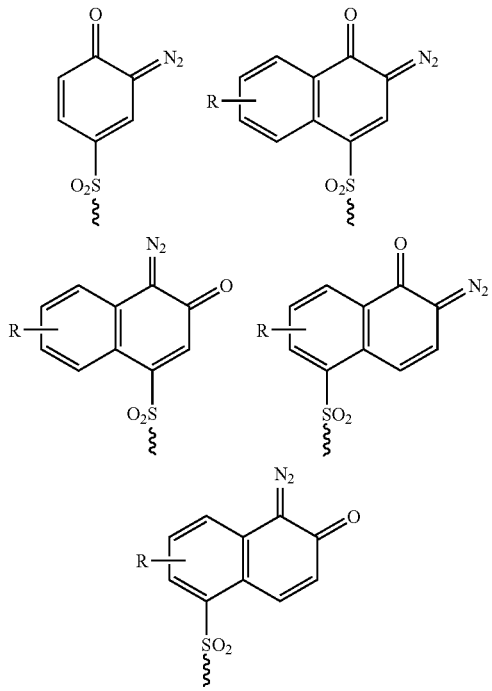

wherein, R is selected from the group consisting of H, halogen, a C$_1$-C$_4$ alkyl group, a C$_1$-C$_4$ alkoxy group, cyclopentyl, and cyclohexyl; k$^1$ is any positive value of up to about 0.5, k$^2$ is any value from about 1.5 to about 2, with the proviso that (k$^1$+k$^2$)=2, G is a monovalent organic group having a group selected from the group consisting of carbonyl, carbonyloxy and sulfonyl group, G* is a divalent organic group having at least one carbonyl or sulfonyl group, Ar$^7$ is a bivalent to octavalent organic group with at least two carbon atoms, Ar$^8$ is a bivalent to hexavalent organic group with at least two carbon atoms, and R$^4$ is selected from the group consisting of hydrogen and an organic group with 1 to 10 carbons, m$^1$ and m$^3$ are integers in the range of 0 to 4 but m$^1$ and m$^3$ cannot be simultaneously 0 and m$^2$ is an integer in the range of 0 to 2; with the proviso that if the polybenzoxazole precursor polymer solely consists of Structure I or III or V or a mixture containing any of these three Structures, then the photosensitive resin composition also comprises (d) at least one photoactive compound.

3. A positive photoresist composition according to claim 2 wherein the polybenzoxazole precursor polymer is at least one polybenzoxazole precursor polymer selected from the group consisting of those of Structures I, II, III, IV and V.

4. A positive photosensitive resin composition according to claim 2 wherein the component of Structure VI is selected from the group consisting of

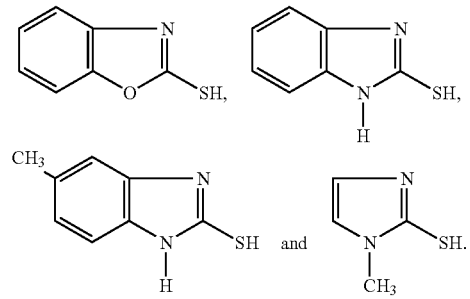

5. A positive photosensitive resin composition according to claim 3 wherein the component of Structure VI is selected from the group consisting of

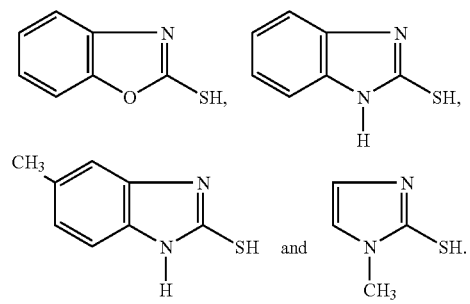

6. A positive photosensitive composition according to claim 2 additionally comprising an adhesion promoter.

7. A positive photosensitive composition according to claim 6 wherein the adhesion promoter is a compound of Structure XIV

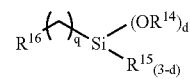

XIV wherein each R$^{14}$ is independently selected from the group consisting of a C$_1$-C$_4$ alkyl group and a C$_5$-C$_7$ cycloalkyl group, each R$^{15}$ is independently selected from the group consisting of a C$_1$-C$_4$ alkyl group, a C$_1$-C$_4$ alkoxy group, a C$_5$-C$_7$ cycloalkyl group and a C$_5$-C$_7$ cycloalkoxy group, d is an integer from 0 to 3 and q is an integer from 1 to about 6, R$^{16}$ is selected from the group consisting of one of the following moieties:

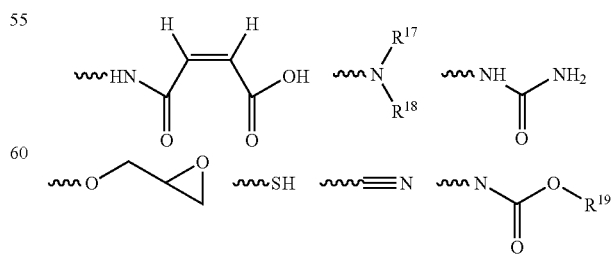

wherein each R$^{17}$ and R$^{18}$ is independently selected from the group consisting of a C$_1$-C$_4$ alkyl group and a C$_5$-C$_7$ cycloalkyl group, and $R^{19}$ is selected from the group consisting of a $C_1$-$C_4$ alkyl group or a $C_5$-$C_7$ cycloalkyl group.

8. A positive photosensitive composition according to claim 3 additionally comprising an adhesion promoter and wherein the adhesion promoter is a compound of Structure XIV

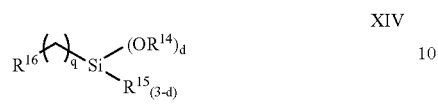

wherein each $R^{14}$ is independently selected from the group consisting of a $C_1$-$C_4$ alkyl group and a $C_5$-$C_7$ cycloalkyl group, each $R^{15}$ is independently selected from the group consisting of a $C_1$-$C_4$ alkyl group, a $C_1$-$C_4$ alkoxy group, a $C_5$-$C_7$ cycloalkyl group and a $C_5$-$C_7$ cycloalkoxy group, d is an integer from 0 to 3 and q is an integer from 1 to about 6, $R^{16}$ is selected from the group consisting of one of the following moieties:

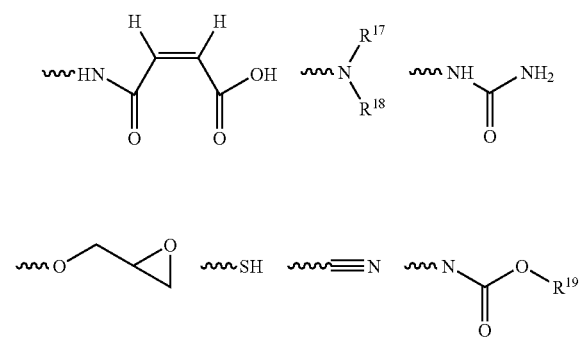

wherein each $R^{17}$ and $R^{18}$ is independently selected from the group consisting of a $C_1$-$C_4$ alkyl group and a $C_5$-$C_7$ cycloalkyl group, and $R^{19}$ is selected from the group consisting of a $C_1$-$C_4$ alkyl group or a $C_5$-$C_7$ cycloalkyl group.

9. A photosensitive composition according to claim 1 comprising a negative working photoresist composition wherein the polybenzoxazole precursor comprises
one or more polybenzoxazole precursor polymers of Structures I or III or III*

III* wherein $Ar^1$ is selected from the group consisting of a tetravalent aromatic group, a tetravalent heterocyclic group, and mixtures thereof; $Ar^2$ is selected from the group consisting of a divalent aromatic, a divalent heterocyclic, a divalent alicyclic, and a divalent aliphatic group that may contain silicon, $Ar^3$ is selected from the group consisting of a divalent aromatic group, a divalent aliphatic group, a divalent heterocyclic group, and mixtures thereof; G is a monovalent organic group having a group selected from the group consisting of carbonyl, carbonyloxy and sulfonyl groups, G* is a divalent organic group having at least one carbonyl or sulfonyl group, x is from about 10 to about 1000; and y is from 0 to about 900;

and the composition additionally comprises
(d) at least one photoactive compound which releases acid upon radiation, and
(e) at least one latent crosslinker which contains at least two ~N—(CH$_2$OR$^{29}$)$_a$ units where a selected from 1 or 2, and $R^{29}$ is a linear or branched $C_1$-$C_8$ alkyl group.

10. A photoresist composition according to claim 9 comprising a negative working photoresist composition wherein the one or more polybenzoxazole precursor polymers is selected from polybenzoxazole precursor polymers of Structures I and III.

11. A negative photosensitive resin composition according to claim 9 wherein the component of Structure VI is selected from the group consisting of

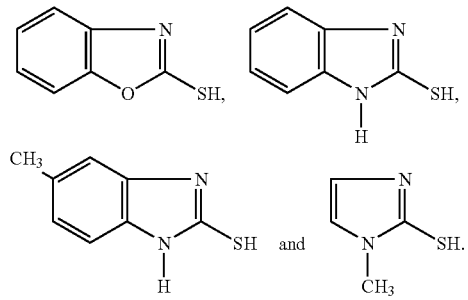

12. A negative photosensitive resin composition according to claim 10 wherein the component of Structure VI is selected from the group consisting of

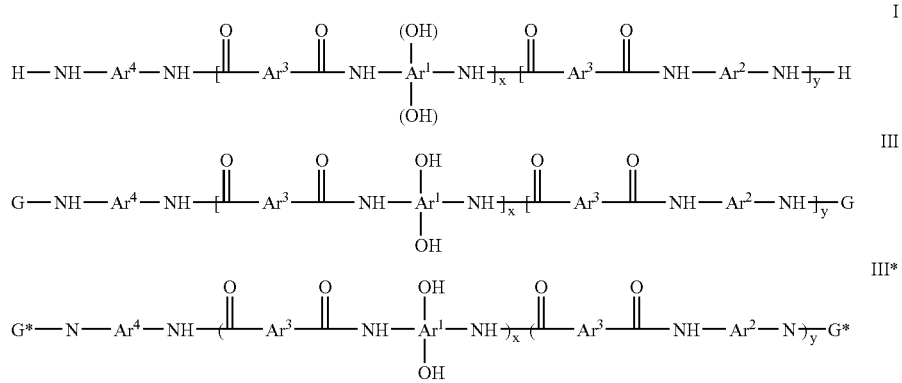

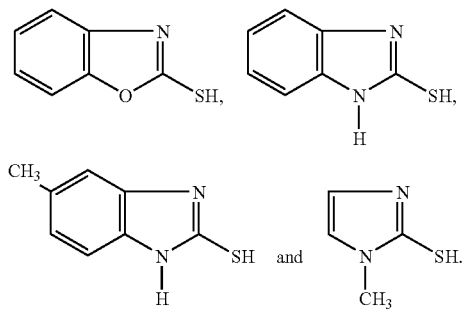

13. A negative photosensitive resin composition according to claim 9 wherein the latent crosslinker is selected from the group consisting of

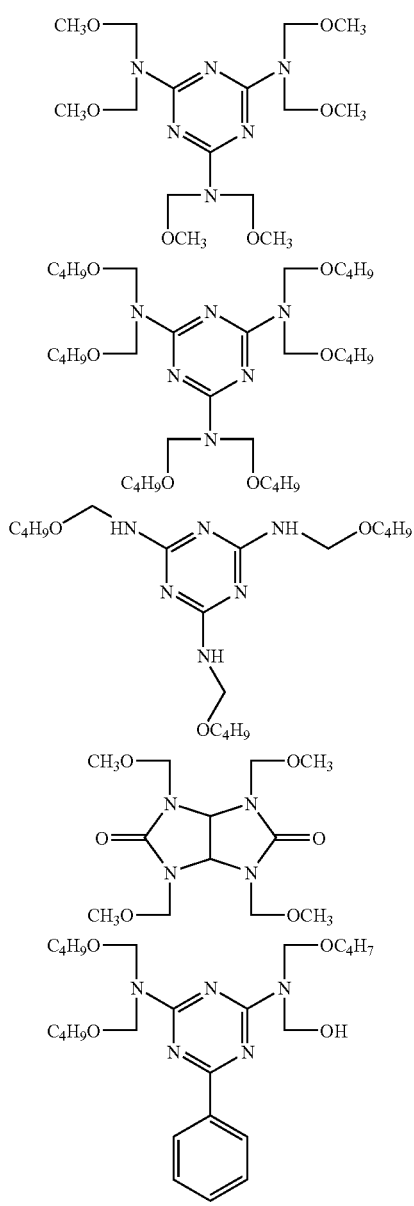

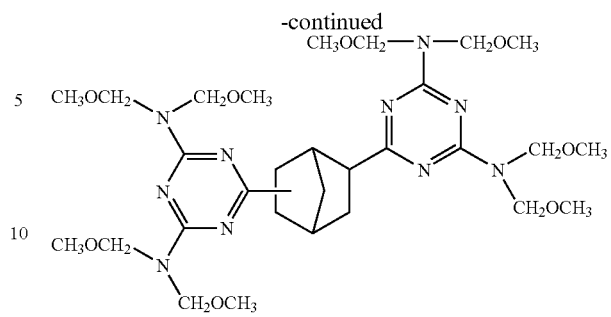

14. A negative photosensitive resin composition according to claim 10 wherein the latent crosslinker is selected from the group consisting of

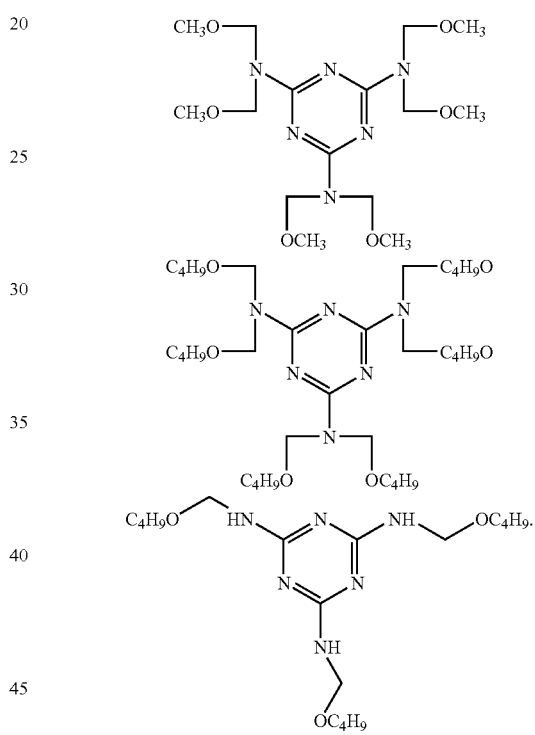

15. A process for forming a relief pattern using the positive photosensitive composition, the process comprising the steps of:
(a) coating on a substrate, a positive-working photosensitive composition according to claim 2;
(b) prebaking the coated substrate;
(c) exposing the prebaked coated substrate to actinic radiation;
(d) developing the exposed coated substrate with an aqueous developer, thereby forming an uncured relief image on the coated substrate; and
(e) baking the developed coated substrate at an elevated temperature, thereby curing the relief image.

16. A process for forming a relief pattern using the positive photosensitive composition, the process comprising the steps of:
(a) coating on a substrate, a positive-working photosensitive composition according to claim 3;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

17. The process according to claim 15 wherein prior to step (a) the substrate is precoated with a solvent containing an adhesion promoter.

18. The process according to claim 16 wherein prior to step (a) the substrate is precoated with a solvent containing an adhesion promoter.

19. A process for forming a negative tone relief image, the process comprising the steps of:

(a) providing a substrate, (b) coating on said substrate, a negative-working photosensitive composition according to claim 9;

(c) exposing the coated substrate to actinic radiation;

(d) post exposure baking the coated substrate at an elevated temperature;

(e) developing the coated substrate with an aqueous developer, thereby forming a relief image; and (f) baking the substrate at an elevated temperature, thereby curing the relief image.

20. A process for forming a negative tone relief image, the process comprising the steps of:

(a) providing a substrate, (b) coating on said substrate, a negative-working photosensitive composition according to claim 10;

(c) exposing the coated substrate to actinic radiation;

(d) post exposure baking the coated substrate at an elevated temperature;

(e) developing the coated substrate with an aqueous developer, thereby forming a relief image; and (f) baking the substrate at an elevated temperature, thereby curing the relief image.

21. The process according to claim 19 wherein prior to step (b) the substrate is precoated with a solvent containing an adhesion promoter.

22. The process according to claim 20 wherein prior to step (b) the substrate is precoated with a solvent containing an adhesion promoter.

23. A relief image on a substrate formed by the process of claim 15.

24. A relief image on a substrate formed by the process of claim 16.

25. A relief image on a substrate formed by the process of claim 19.

26. A relief image on a substrate formed by the process of claim 20.

* * * * *

UNITED STATES PATENT AND TRADEMARK OFFICE
CERTIFICATE OF CORRECTION

PATENT NO. : 7,407,731 B2  Page 1 of 1
APPLICATION NO. : 11/386471
DATED : August 5, 2008
INVENTOR(S) : Naiini et al.

It is certified that error appears in the above-identified patent and that said Letters Patent is hereby corrected as shown below:

Column 82
Line 1, before "wherein" delete -- III* --.

Column 84
Lines 29-37, delete " 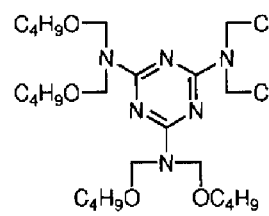 ", insert -- 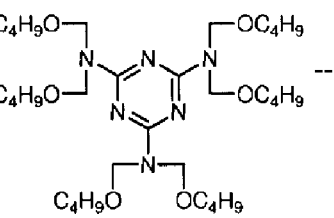 --.

Signed and Sealed this

Twenty-first Day of October, 2008

JON W. DUDAS
*Director of the United States Patent and Trademark Office*